(12) United States Patent  
Hellberg et al.

(10) Patent No.: US 7,893,762 B2
(45) Date of Patent: Feb. 22, 2011

(54) EFFICIENT COMPOSITE AMPLIFIER

(75) Inventors: Richard Hellberg, Huddinge (SE); Mats Klingberg, Enskede (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 359 days.

(21) Appl. No.: 12/159,735

(22) PCT Filed: Dec. 30, 2005

(86) PCT No.: PCT/SE2005/002066

§ 371 (c)(1),
(2), (4) Date: Jun. 30, 2008

(87) PCT Pub. No.: WO2007/078217

PCT Pub. Date: Jul. 12, 2007

(65) Prior Publication Data

US 2009/0021301 A1    Jan. 22, 2009

(51) Int. Cl.
*H03F 3/68* (2006.01)

(52) U.S. Cl. .................................. 330/124 R; 330/295

(58) Field of Classification Search ............ 330/124 R, 330/295, 84, 125
See application file for complete search history.

(56) References Cited

U.S. PATENT DOCUMENTS

| 5,012,200 | A | 4/1991 | Meinzer |
| 5,568,086 | A | 10/1996 | Schuss et al. |
| 5,901,346 | A | 5/1999 | Stengel et al. |
| 6,054,896 | A | 4/2000 | Wright et al. |
| 6,940,349 | B2 * | 9/2005 | Hellberg ................. 330/124 R |
| 7,304,537 | B2 * | 12/2007 | Kwon et al. ............. 330/124 R |
| 7,557,652 | B2 * | 7/2009 | Klingberg et al. ........ 330/124 R |
| 2003/0137346 | A1 | 7/2003 | Hellburg |

FOREIGN PATENT DOCUMENTS

| EP | 1 583 228 A2 | 10/2005 |
| WO | WO 01/91282 A2 | 11/2001 |
| WO | WO 01/95480 A1 | 12/2001 |
| WO | WO 02/05421 A1 | 1/2002 |
| WO | WO 03/047093 A1 | 6/2003 |
| WO | WO 03/061115 A1 | 7/2003 |
| WO | WO 2004/023647 A1 | 3/2004 |
| WO | WO 2004/057755 A1 | 7/2004 |
| WO | WO 2005/031966 A1 | 4/2005 |

OTHER PUBLICATIONS

H. Chireix, "High Power Outphasing Modulation", Proc. IRE, vol. 23, No. 2, pp. 1370-1392, Nov. 1935.
W. H. Doherty, "A New High Efficiency Power Amplifier for Modulated Waves", Proc. IRE, vol. 24, No. 9, pp. 1163-1182, Sep. 1936.
F. H. Raab, "Efficiency of Outphasing RF Power Amplifier Systems", IEEE Trans. Communications, vol. COM-33, No. 10, pp. 1094-1099. Oct. 1985.

(Continued)

*Primary Examiner*—Henry K Choe

(57) ABSTRACT

A detuned composite amplifier includes a nonlinear drive function (22) that has a phase that varies with the composite amplifier output voltage amplitude. The nonlinear drive function (22) is configured to transform the output voltage transition point of the prior art into an extended output voltage transition region to increase the efficiency of the composite amplifier.

27 Claims, 29 Drawing Sheets

OTHER PUBLICATIONS

B. Stengel and W. R. Eisenstadt, "LINC Power Amplifier Combiner Method Efficiency Optimization", IEEE Trans. Vehicular Technology, vol. 49, No. 1, pp. 229-234, Jan. 2000.

X. Zhang and L. E. Larson, "Gain and Phase Error-Free LINC Transmitter", IEEE Trans. Vehicular Technology, vol. 49, No. 5, pp. 1986-1994, Sep. 2000.

"Ampliphase AM Transmission System", ABU Technical Review, No. 33, pp. 10-18, Jul. 1974.

I. Ullah, "Output Circuit of an Ampliphase Broadcast Transmitter", ABU Technical Review, No. 63, pp. 17-24, Jul. 1979.

F. H. Raab, "Efficiency of Doherty RF Power Amplifier Systems", IEEE Trans. Broadcasting, vol. BC-33, No. 3, pp. 77-83, Sep. 1987.

D. M. Upton et al. "A New Circuit Topology to Realize High Efficiency, High Linearity, and High Power Microwave Amplifiers", IEEE Proc. RAWCON[1] 98, pp. 317-320.

\* cited by examiner

NORMALIZED AMPLIFIER OUTPUT VOLTAGE AMPLITUDE vs. NORMALIZED CHIREIX AMPLIFIER OUTPUT VOLTAGE AMPLITUDE (PRIOR ART)

AMPLIFIER OUTPUT VOLTAGE PHASE vs. NORMALIZED CHIREIX AMPLIFIER OUTPUT VOLTAGE AMPLITUDE (PRIOR ART)

NORMALIZED CHIREIX AMPLIFIER
OUTPUT VOLTAGE AMPLITUDE
(PRIOR ART)

NORMALIZED CHIREIX AMPLIFIER
OUTPUT VOLTAGE AMPLITUDE
(PRIOR ART)

NORMALIZED DOHERTY AMPLIFIER
OUTPUT VOLTAGE AMPLITUDE
(PRIOR ART)

NORMALIZED DOHERTY AMPLIFIER
OUTPUT VOLTAGE AMPLITUDE
(PRIOR ART)

EFFICIENT COMPOSITE AMPLIFIER

TECHNICAL FIELD

The present invention relates to composite amplifiers, and especially to a method and arrangement for increasing the efficiency of such amplifiers.

BACKGROUND

In many wireless communications systems, the power amplifier (PA) in the transmitter is required to be very linear, in addition to being able to simultaneously amplify many radio channels (frequencies) spread across a fairly wide bandwidth. It also has to do this efficiently, in order to reduce power consumption and need for cooling, and to increase its longevity. High linearity is required, since nonlinear amplifiers would cause leakage of interfering signal energy between channels.

The amplitude probability density of a mix of sufficiently many independent radio frequency (RF) channels, or of a multi-user CDMA (Code Division Multiple Access) signal, tends to be close to a Rayleigh distribution having a large peak-to-average power ratio. Since a conventional RF power amplifier generally has an efficiency proportional to its output amplitude, its average efficiency is very low for such signals.

In response to the low efficiency of conventional linear power amplifiers, many methods have been proposed. Two of the most promising are the Chireix outphasing method [1], and the Doherty method [2].

To minimize the costs for producing the efficient power amplifiers described in the previous sections, one would like to avoid trimming. Since component values and electrical lengths of transmission lines vary between the produced amplifiers, they will all be more or less detuned or off balance. One problem that so far has remained unsolved is how to obtain maximum efficiency (i.e. best possible under such conditions) from an imperfect composite amplifier.

SUMMARY

An object of the present invention is to efficiently drive a detuned composite power amplifier.

This object is achieved in accordance with the attached claims.

Briefly, the present invention provides a nonlinear drive function that has a phase that varies with the composite amplifier output voltage amplitude. This feature enables splitting of the described transition points into transition regions, which increases amplifier efficiency. In fact this feature may actually be used to deliberately detune amplifiers to increase efficiency.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings.

Furthermore, although they are not identical, the output networks of both Chireix and LINC amplifiers will be denoted Chireix type output network or combiner.

Before the invention is described in detail, the Chireix and Doherty amplifier and known variations thereof will be briefly described.

Figure 1:
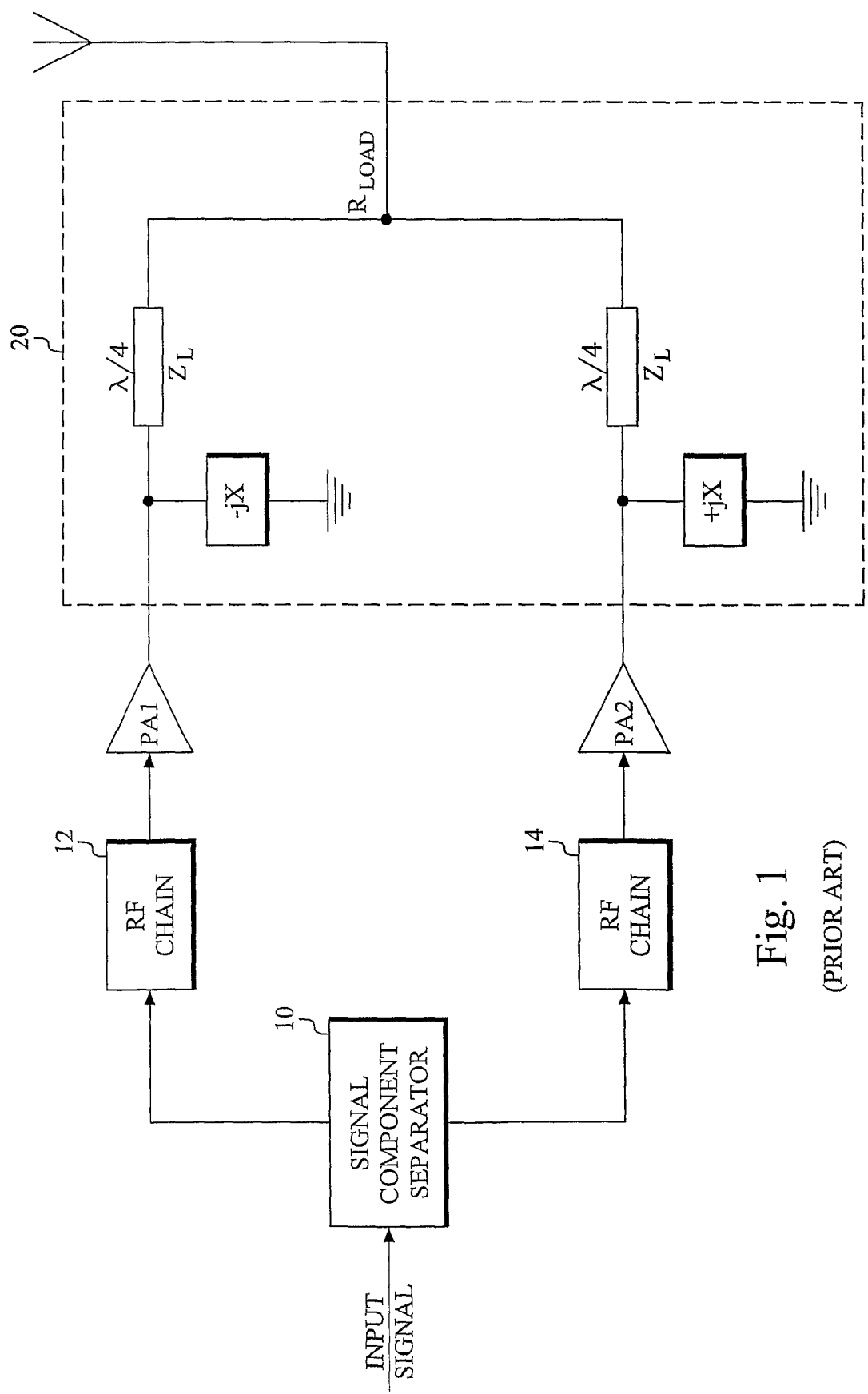
FIG. 1 is a block diagram of a Chireix amplifier.

FIG. 1 is a block diagram of a typical prior art Chireix amplifier. The term "outphasing", which is the key method in Chireix and LINC amplifiers, generally means the method of obtaining amplitude modulation by combining two phase-modulated constant-amplitude signals produced in a signal component separator 10. After up-conversion and amplification through RF chains 12, 14 (mixers, filters, amplifiers) and power amplifiers PA1, PA2, the outphased signals are combined to form an amplified linear signal in a Chireix type output network 20. The phases of these constant-amplitude outphased signals are chosen so that the result from their vector-summation yields the desired amplitude. Output network 20 includes two quarter-wave lines $\lambda/4$ (where $\lambda$ is the wavelength corresponding to the center frequency of the amplifier) and two compensating reactances +jX and −jX, which are used to extend the region of high efficiency to include lower output power levels. In [3, 4] the efficiency of Chireix systems is analyzed. In [5, 8, 9] methods to overcome nonlinearity due to gain and phase imbalances are described. The Chireix method has also been used in broadcast transmitters under the trademark Ampliphase [6, 7]. According to an enhancement described in [21, 13] the constituent amplifiers should be driven linearly below the transition point to increase the efficiency.

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size (equal maximum output power) amplifiers can be used.

Another embodiment of the output network of a Chireix amplifier can be built by shortening and lengthening the $\lambda/4$-lines by a quantity $\delta$, while keeping the sum of the two lines at $\lambda/2$, instead of using compensating reactances. Such an embodiment is described in [16] and illustrated in FIG. 2.

The amplitudes and phases of the constituent amplifier (PA1 and PA2) output node voltages and output currents for a Chireix amplifier with lengthened and shortened transmission lines in the output network according to [16] are shown in FIG. 3-6. The transition point T is here at 0.4 of the maximum output voltage, which is optimal for this amplifier.

Figure 2:
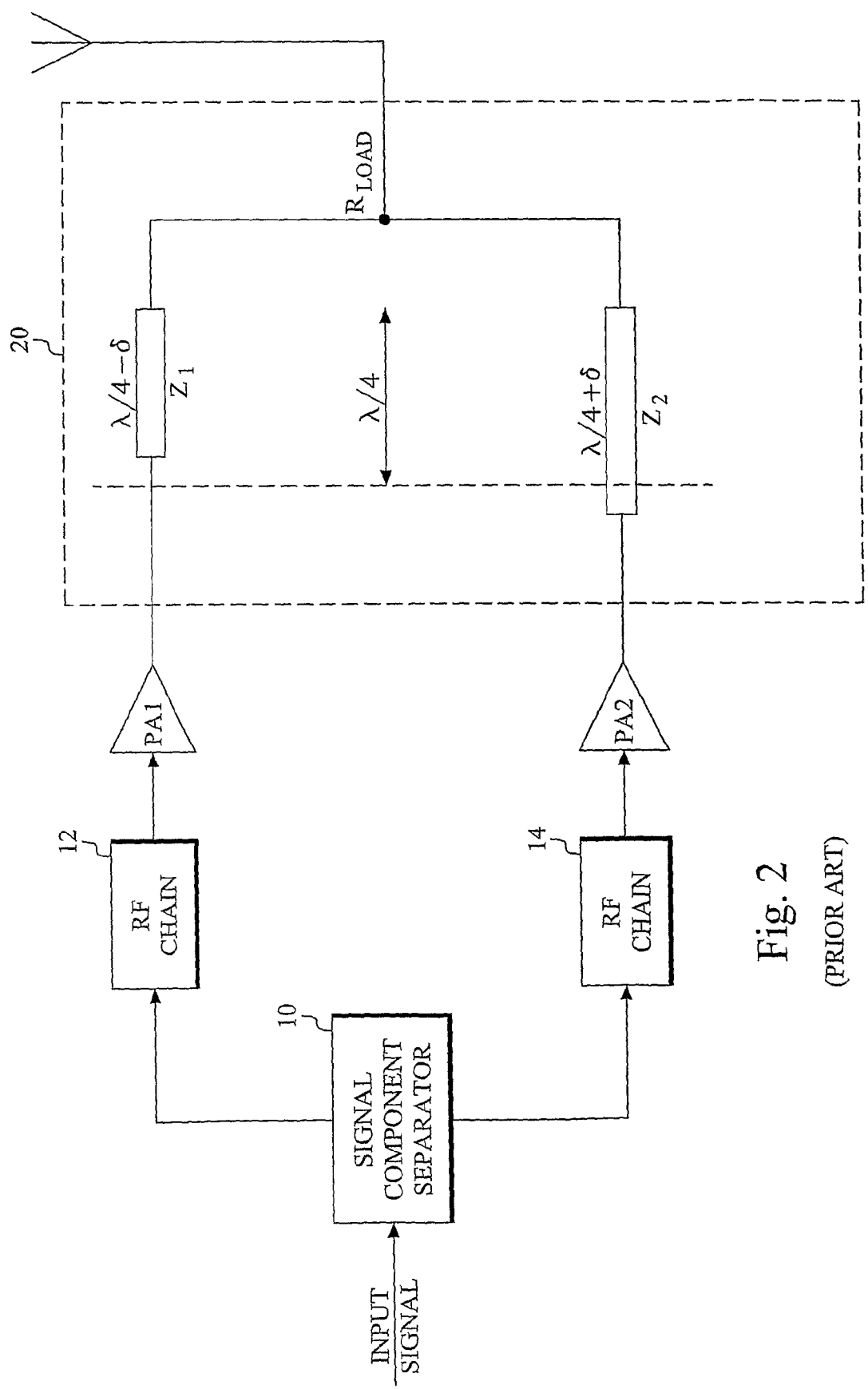
FIG. 2 is a block diagram of a Chireix amplifier with a modified output network.
Figure 7:
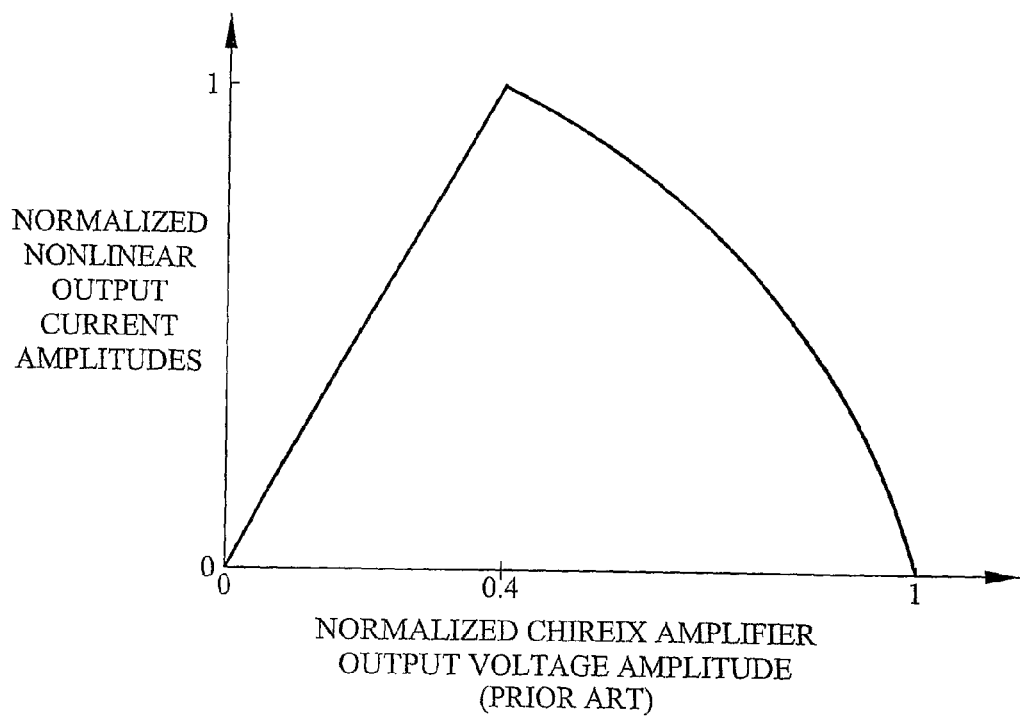
FIG. 7 is a diagram of the nonlinear function of a Chireix amplifier.

According to [16] the Chireix amplifier drive signals from signal component separator 10 in FIG. 2 include a linear plus or minus a nonlinear component (plus to one power amplifier and minus to the other power amplifier). By separating each constant-amplitude phase-modulated signal from a standard signal component separator 10 into a linear part and a modified nonlinear part, changing the amplitude and phase of these components individually according to a set of specific rules, and recombining the parts into a signal with new properties according to [16], it is possible to obtain a Chireix amplifier with substantially lower drive power consumption than the standard Chireix amplifier. The nonlinear function of the input signal for the drive decomposition of [16] is shown in FIG. 7. It is important to note that even though the voltages and currents in the Chireix amplifier have varying phases, the decomposed nonlinear function has the same phase at all amplitudes. This nonlinear function is applied to the output currents of both constituent amplifiers.

Figure 8:
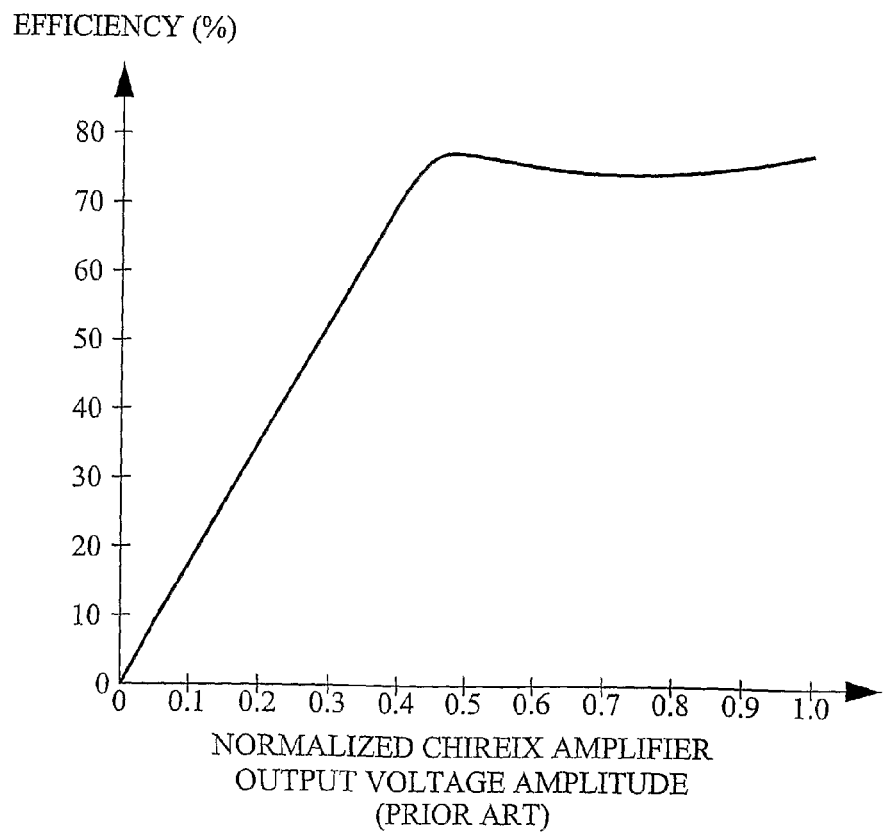
FIG. 8 is a diagram illustrating how the efficiency of the Chireix amplifier depends on the normalized Chireix amplifier output voltage.

For the Chireix amplifier illustrated in FIG. 2, built with transmission lines of 0.32λ and 0.18λ electrical length according to [16], the efficiency curve peaks at 0.47 of the maximum output voltage, as shown in FIG. 8.

Figure 9:
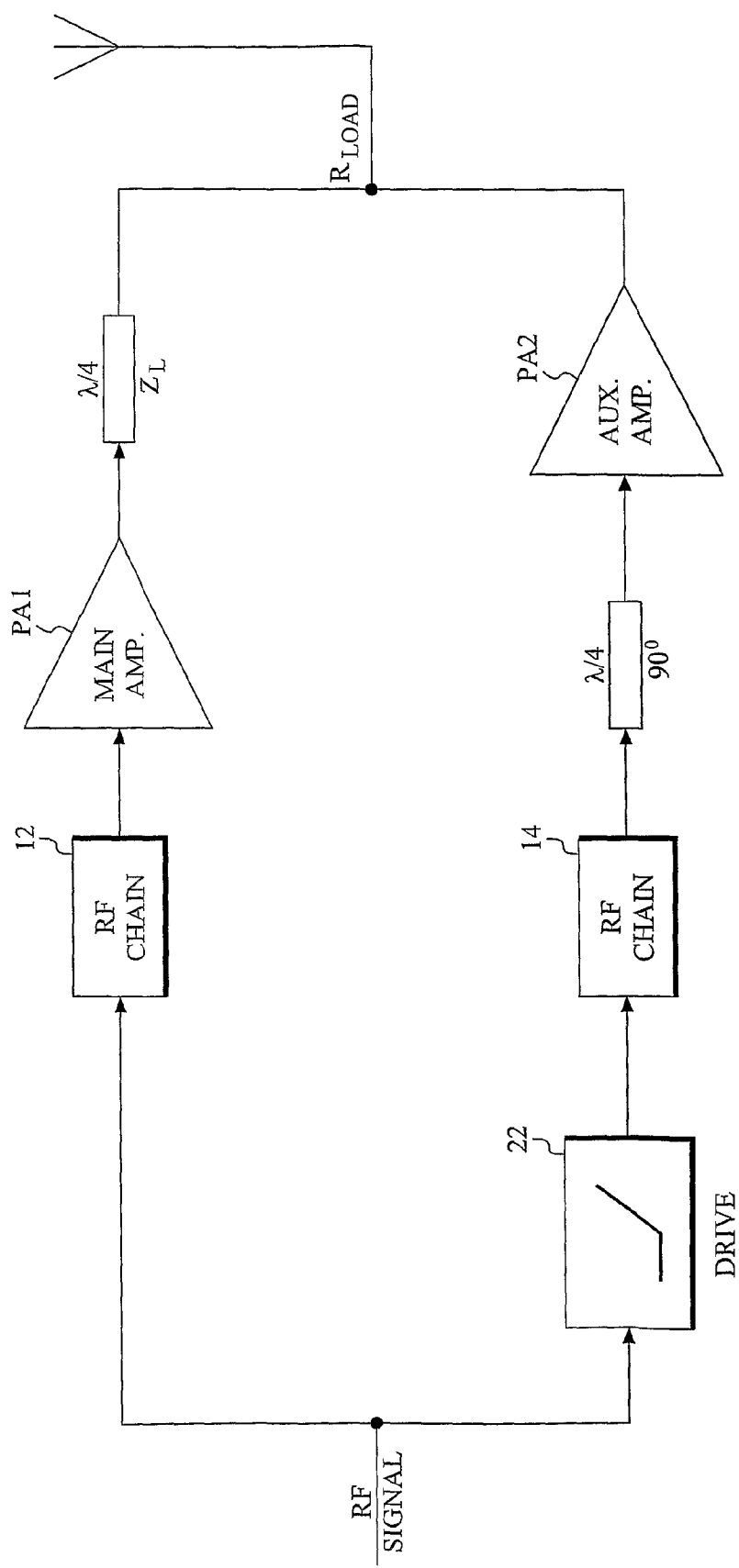
FIG. 9 is a block diagram of a Doherty amplifier.
Figure 10:
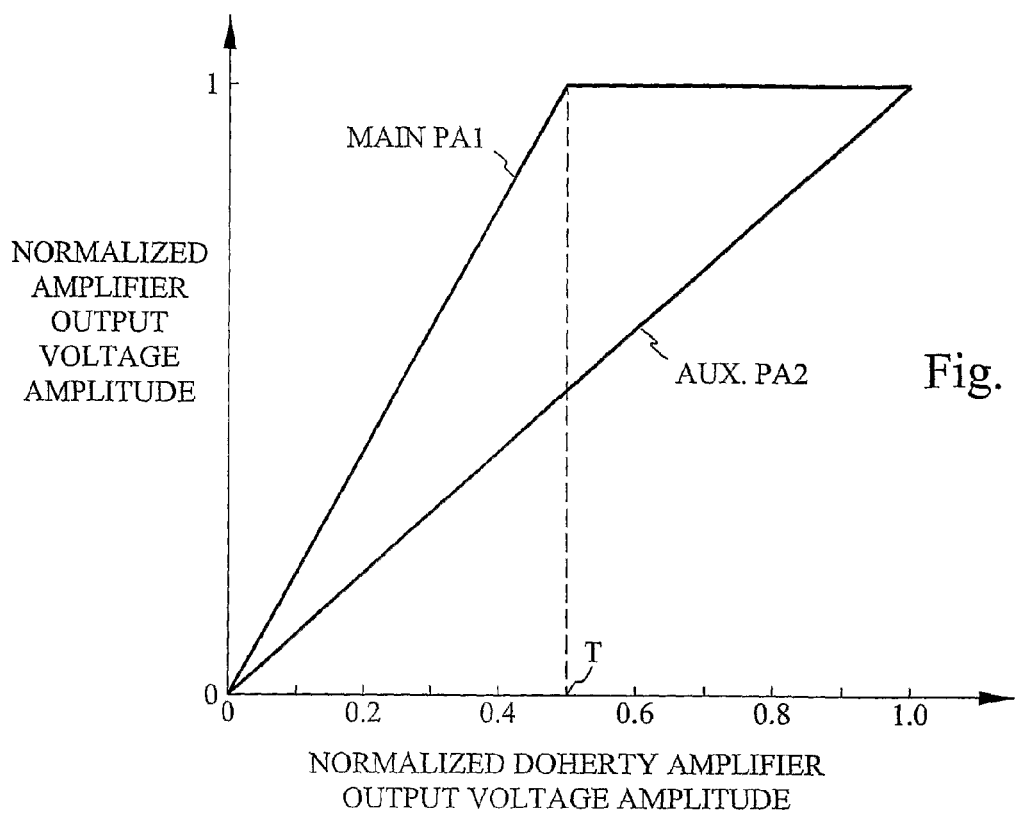
FIG. 10 is a diagram illustrating how the amplitude of the output voltage of the main and auxiliary amplifier, respectively, depends on the normalized Doherty amplifier output voltage.
Figure 11:
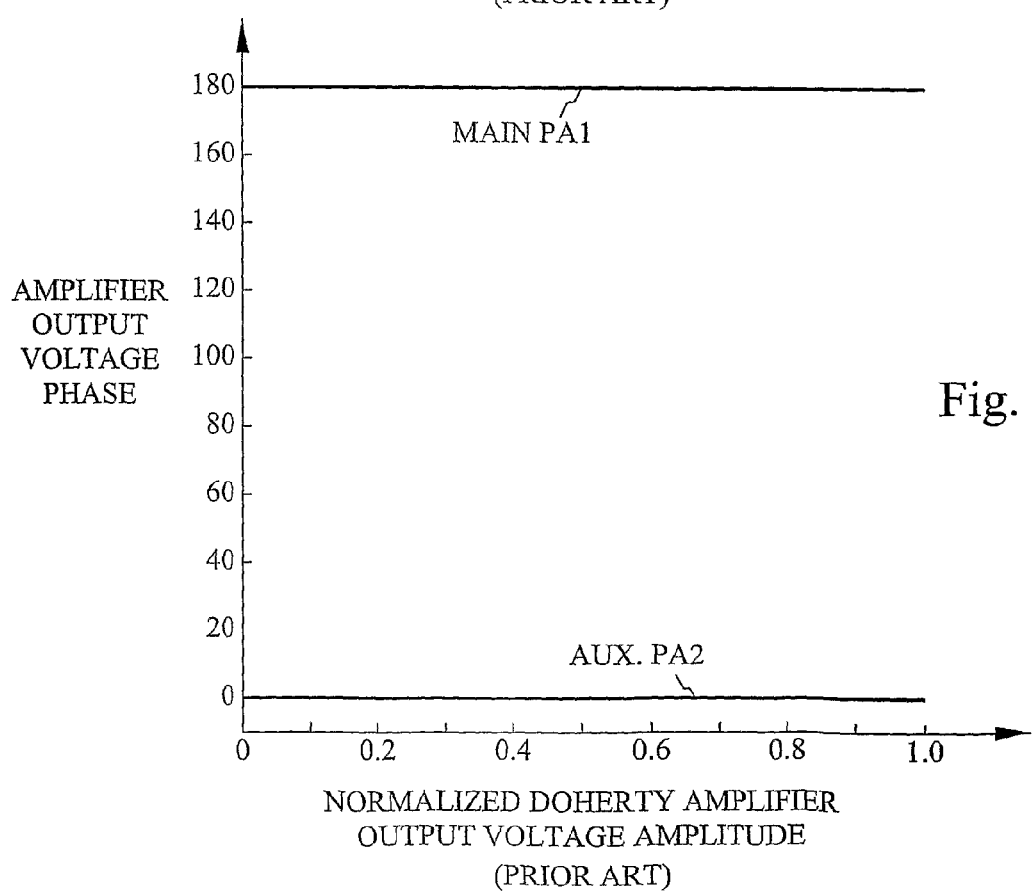
FIG. 11 is a diagram illustrating how the phase of the output voltage of the main and auxiliary amplifier, respectively, depends on the normalized Doherty amplifier output voltage.
Figure 12:
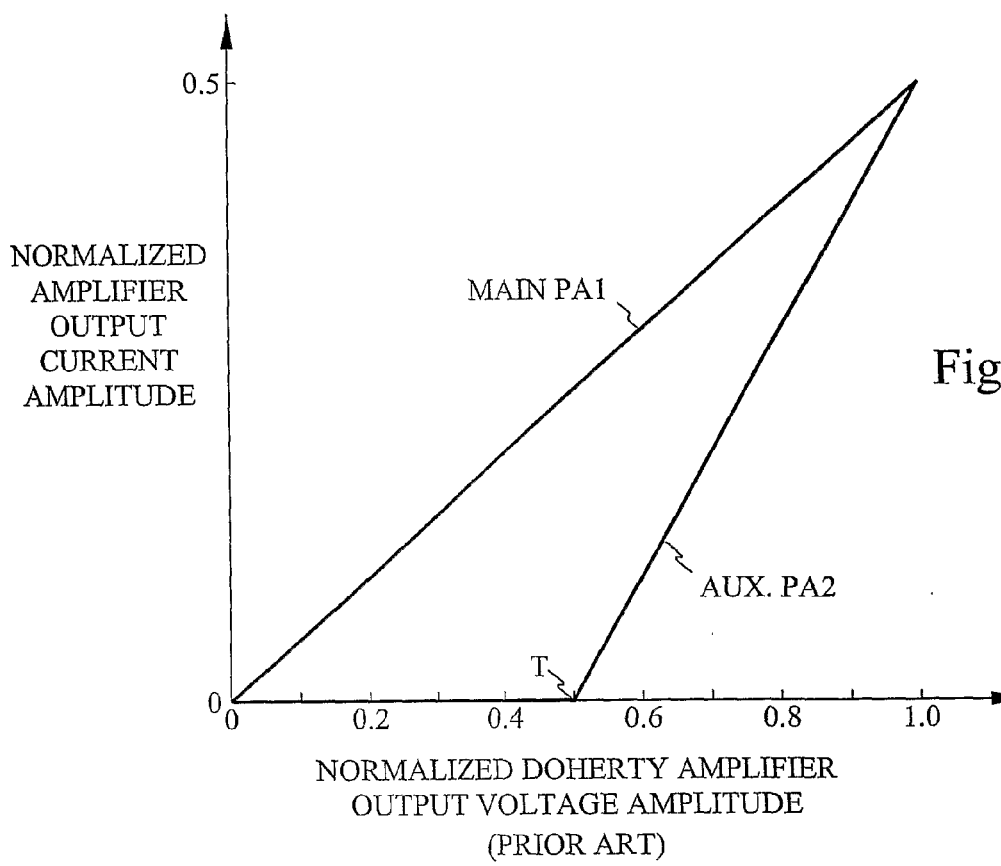
FIG. 12 is a diagram illustrating how the amplitude of the output current of the main and auxiliary amplifier, respectively, depends on the normalized Doherty amplifier output voltage.
Figure 13:
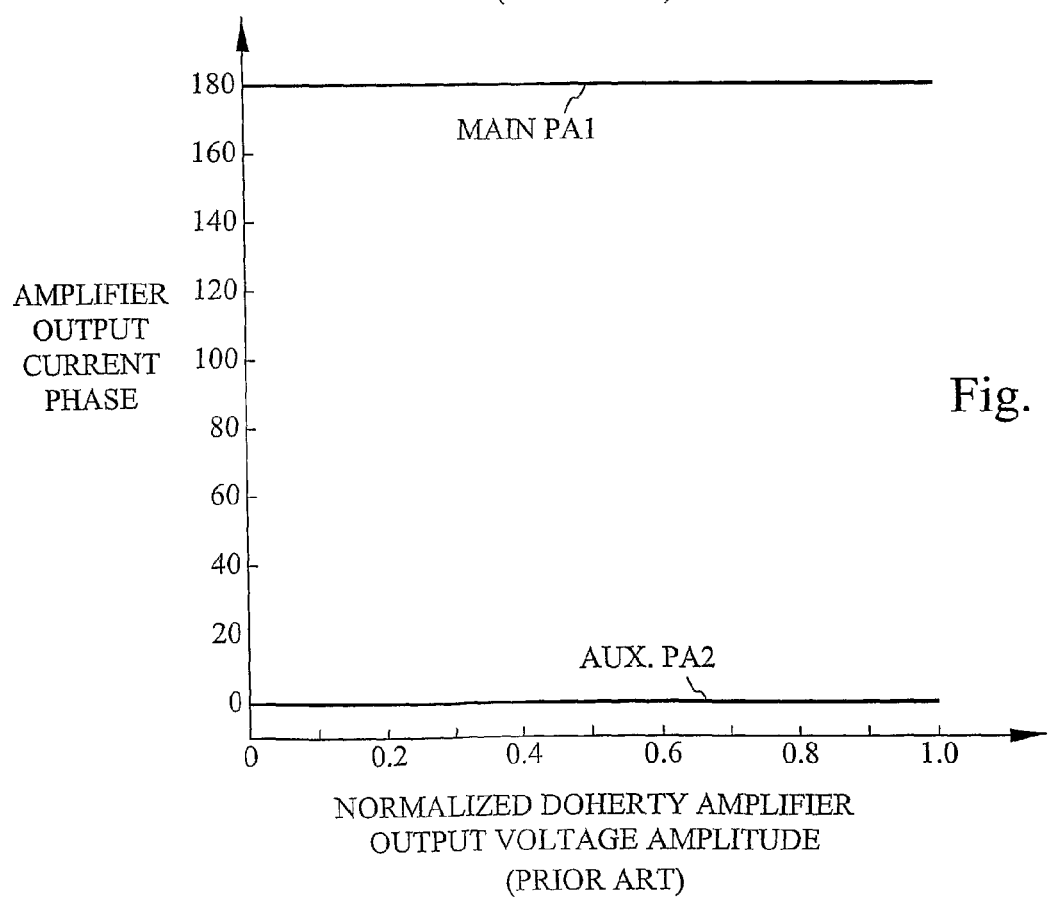
FIG. 13 is a diagram illustrating how the phase of the output current of the main and auxiliary amplifier, respectively, depends on the normalized Doherty amplifier output voltage.

FIG. 9 is a block diagram of a typical prior art Doherty amplifier. The Doherty amplifier uses one linear and one nonlinear power amplifier branch. The published theory states that a main power amplifier PA1 is driven as a linear amplifier in class B, and an auxiliary power amplifier PA2 having nonlinear output current (through class C operation or some other technique represented by block 22) "modulates" the impedance seen by the main amplifier, through the impedance-inverting quarter-wave line (see [2, 10]) in the output network. Since the nonlinear output current of the auxiliary amplifier is zero below a certain transition (output) voltage, the auxiliary amplifier does not contribute to the power loss below this voltage. An alternative output structure with built-in impedance matching is described in [11, 12].

The transition point T of the standard Doherty amplifier is at half the maximum output voltage. With this transition point the efficiency curve is most suited for moderate peak-to-average power ratios, and the peak power is divided equally between the two constituent amplifiers. The transition point in the Doherty amplifier can be changed by changing the impedance of the quarter-wave transmission line (or equivalent circuit). The efficiency curve can then be adjusted for higher peak-to-average power ratios, and the peak output power will be unequally divided between the amplifiers. Different size amplifiers will thus be needed for optimum utilization of the available peak power.

The amplitudes and phases of the constituent amplifier (i.e. transistor) output node voltages and output currents versus the normalized output voltage, for a Doherty amplifier with two equal amplifiers, are shown in FIG. 10-13.

Figure 14:
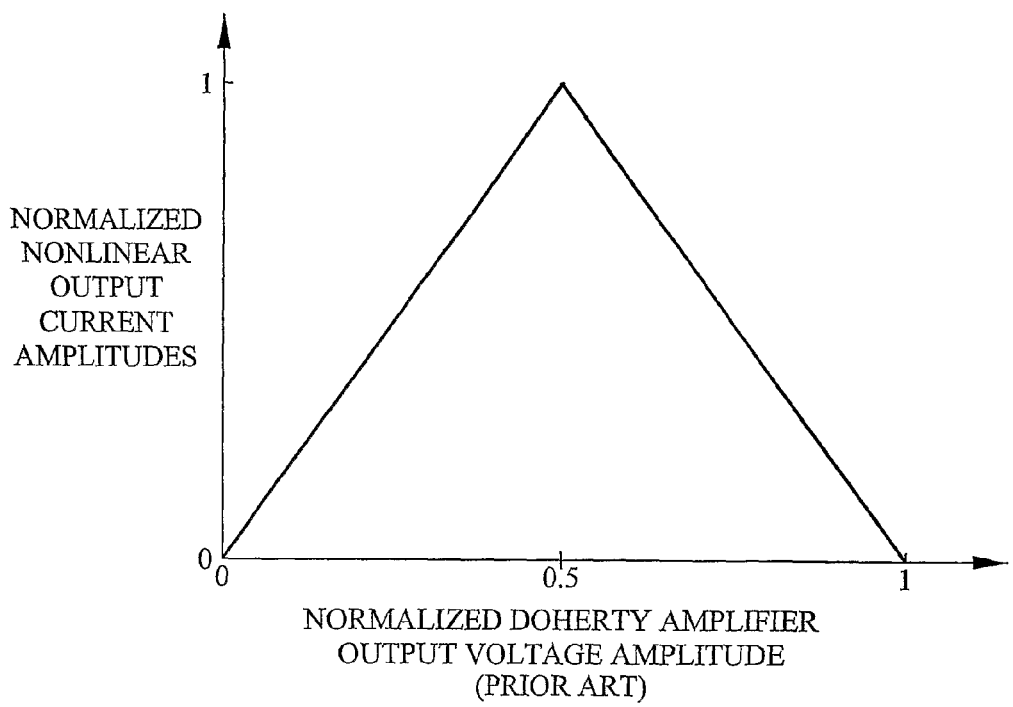
FIG. 14 is a diagram of the nonlinear function of a Doherty amplifier.

The nonlinear function 22 used in the original Doherty amplifier has the shape of the auxiliary amplifier (PA2) output current. The nonlinear function of the input signal according to the unified drive decomposition of [16] is shown in FIG. 14. This nonlinear function has the same phase at all amplitudes and is optimal for a perfectly tuned Doherty amplifier. It is included here as a reference for the nonlinear functions of the present invention described below.

Figure 15:
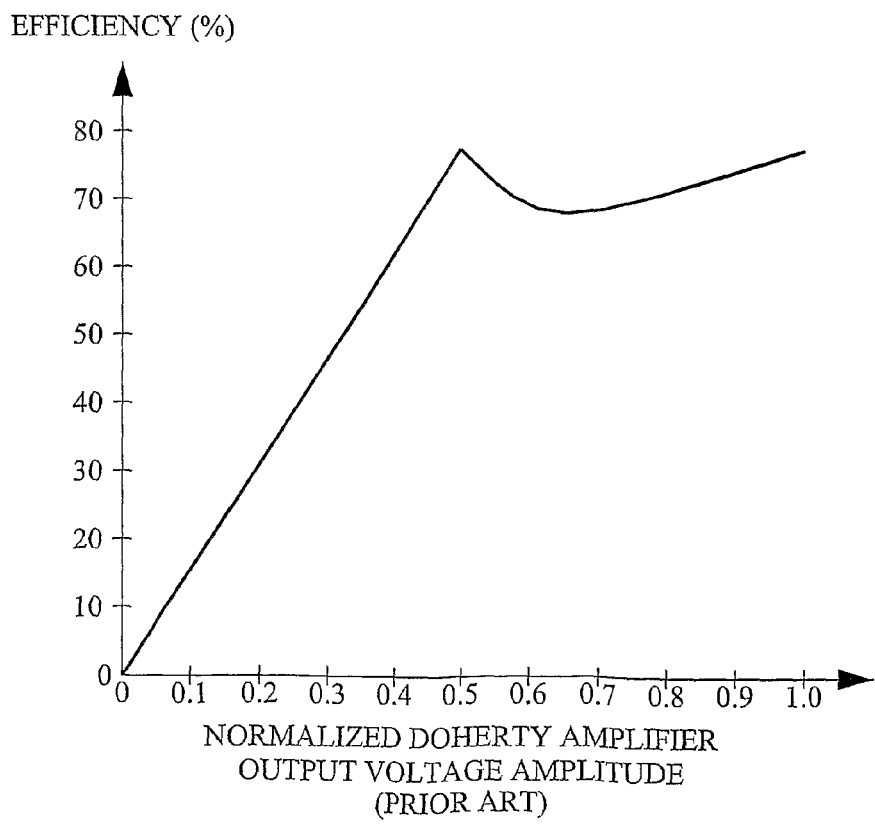
FIG. 15 is a diagram illustrating how the efficiency of the Doherty amplifier depends on the normalized output voltage.

For the Doherty amplifier the efficiency curve has a peak at the transition point, which for the exemplary amplifier with equal constituent amplifiers is at 0.5 of the maximum output voltage, as shown in FIG. 15.

Recently a new theory for the Doherty amplifier has been developed, that led to the invention of wideband distortion-canceling and efficiency-optimized Doherty amplifiers [14]. Thereafter, a new way of operating Chireix amplifiers with increased efficiency was devised [15], which at the same time allows the distortion-canceling method of the invention in [14] to be utilized.

A unified way to build and operate (while having linear output) both Doherty and Chireix amplifiers, as well as most others, is described in [16].

Well-designed amplifiers with three or more independently controlled transistors can be used to increase efficiency above what was previously attainable with multistage Doherty amplifiers [10] having the same number of transistors. Combinations of Chireix and Doherty properties at different output levels have been described in [17] (multistage Chireix structures and drive), [18] (combinations of Doherty and Chireix structures and drive), and [19] (improved drive for a prior art amplifier structure).

A drawback of all the described systems is that the described methods for driving them are maximally efficient only for perfectly tuned systems. Thus, if the power amplifiers or the output networks are mismatched, the efficiency is decreased. The present invention describes a method for increasing efficiency also for detuned composite amplifiers.

The solution involves "splitting" a region between two transition points (or a transition point and an end point) in a composite amplifier into two new regions. In some amplifiers this is easier understood as splitting the single transition point into two transition points with a new intermediate region inbetween. Efficiency can be increased compared to the previous solutions irrespective of the amount of detuning or variations in component values. The problem of obtaining maximum efficiency from an imperfect amplifier is solved by this method.

Both state of the art solutions, the Doherty amplifier [2] and the modified Chireix amplifier [21, 13], use a single transition point T. In the Doherty case, the main transistor works alone at low output levels, and the auxiliary transistor is used only above the transition point, see FIG. 12. In the modified Chireix amplifier, the amplifier is driven in "outphasing" mode above the transition point, and both constituent amplifiers (transistors) are driven linearly with equal amplitude and constant phase difference below this point.

It has been shown [16] that the output network drive ("output", "excitation") currents can be generally decomposed into linear parts and nonlinear parts, where the linear parts provide the actual output signal, and the nonlinear parts, which are forced not to be seen in the output signal by having a special relationship between them [14], are used to reduce the average output current amplitudes. The solutions presented here do not change any of this, but only modify the shape of the nonlinear drive current parts to more optimally reduce the average currents. The modification allows the nonlinear drive current part to have different phases at different amplitudes.

How the solution in accordance with the present invention is implemented in different amplifiers will now be examined in a number of different cases. In all examples (including the previous ones) the maximum output voltage and also the maximum node voltages are normalized. The output network structure from [16], shown in FIG. 2, is used and the load resistance is set to one. This means that the sum of the inverses of the optimum load resistances for the transistors is also equal to one, as is the sum of the maximum output RF currents. The first two examples are improvements over the state of the art solutions. Examples 3 and 4 describe how the solution can be used to improve the system in special cases. Example 5 describes a three-transistor amplifier that combines properties from the first two examples. The generic structure of FIG. 2 is used also for example 5, with an extra branch consisting of a transistor PA3 and a transmission line connecting it to the common output (where the transmission lines from PA1 and PA2 join). In these examples RP chains 14, 16 will be omitted to avoid cluttering of the drawings, since they are not necessary to explain the present invention.

EXAMPLE 1

Detuned Chireix Amplifier

Figure 16:
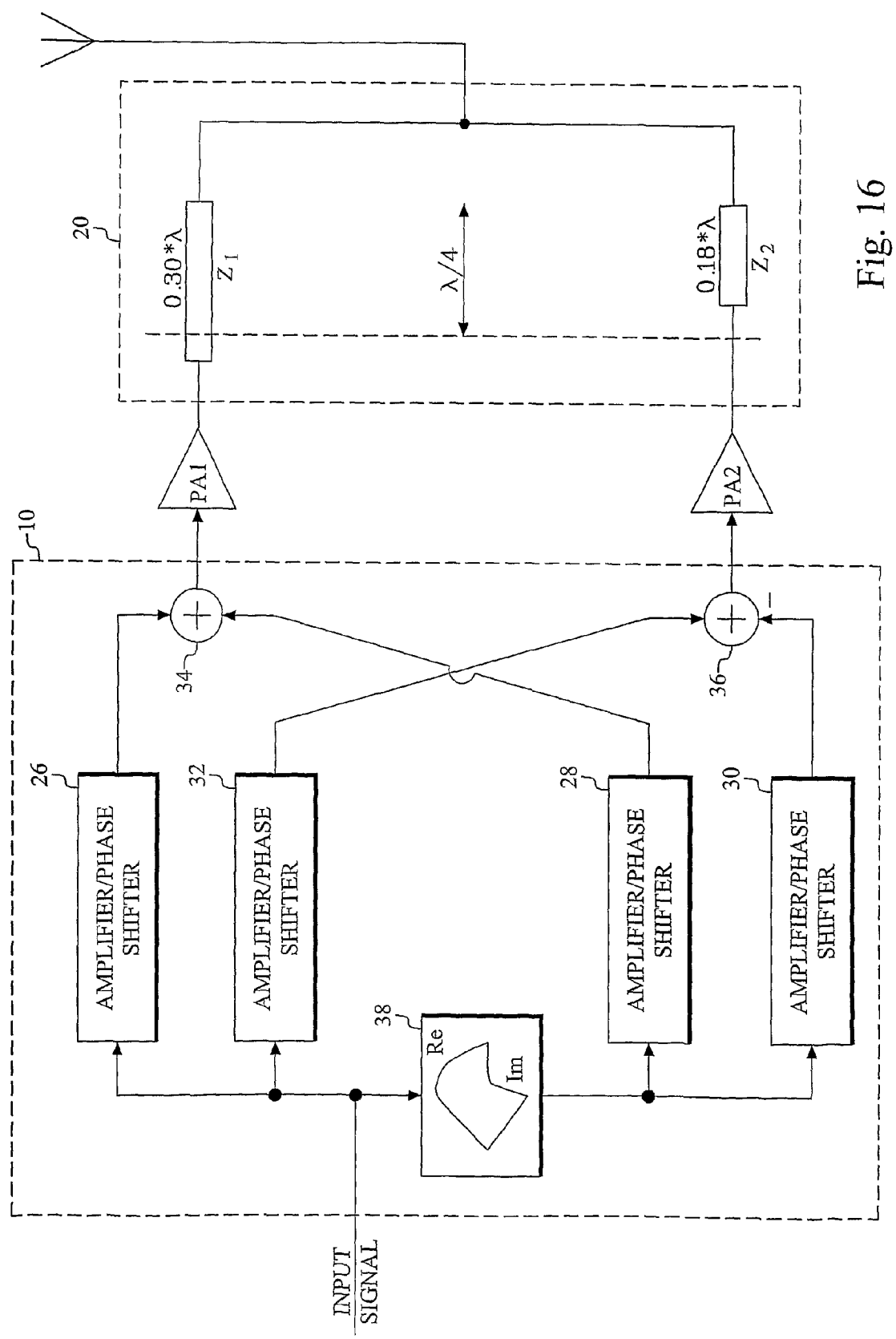
FIG. 16 is a block diagram of a detuned Chireix amplifier.
Figure 17:
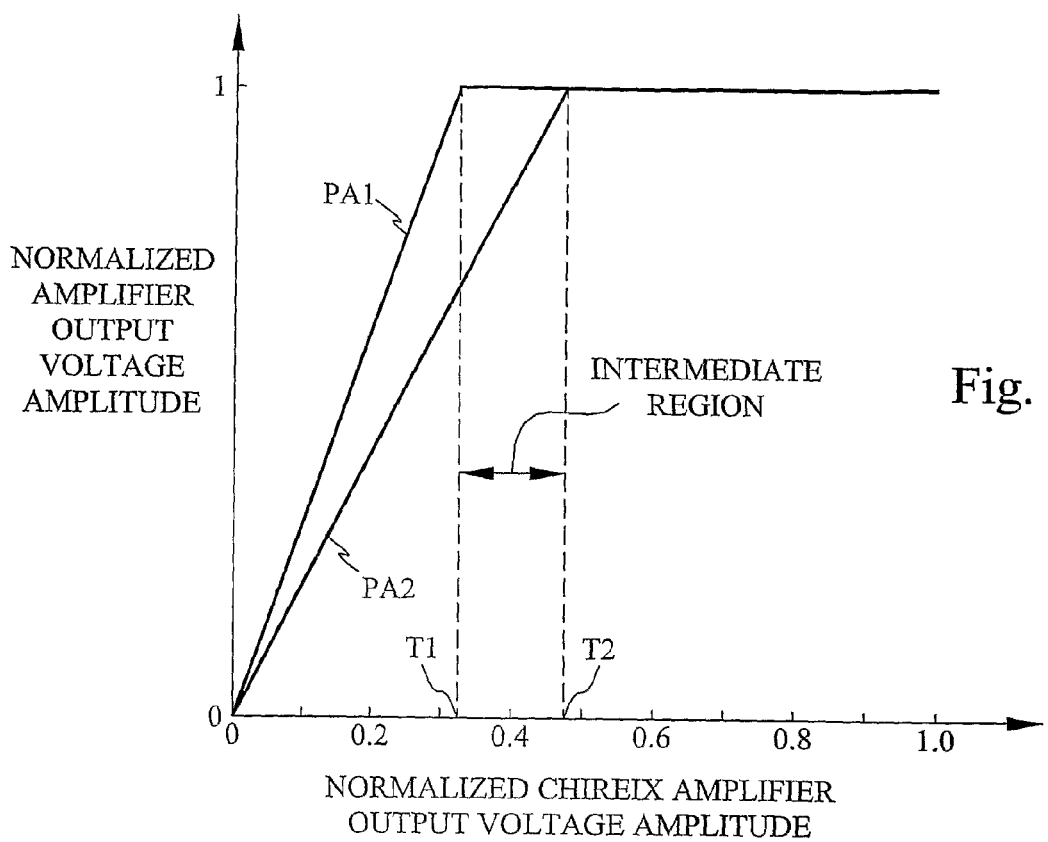
FIG. 17 is a diagram illustrating how the amplitude of the output voltage of the constituent amplifiers in FIG. 16 depends on the normalized Chireix amplifier output voltage.

By letting the sum of the transmission line lengths differ slightly from ½, we have a "detuned" Chireix amplifier. In the case presented here, the electrical lengths are 0.30λ (from PA1 to the common output) and 0.18λ (from PA2) which sums to 0.48λ (instead of the correct value 0.5λ), as illustrated in FIG. 16. This can be seen as a Chireix amplifier operating at 4% below its nominal frequency. On the input side, linear drive signal components are produced by amplifier/phase shifter 26 and 32 directly from the input signal. Similarly, nonlinear drive signal components are generated by a nonlinear element 38 and amplifier/phase shifter 28 and 30. Unit 38 may, for example, be implemented as a combination of a lookup table followed by D/A converters in which a digital input signal amplitude is transformed into the proper drive signals (the input signal amplitude is assumed to be proportional to the composite amplifier output voltage amplitude). However, analog implementations are also possible. The nonlinear signal from amplifier/phase shifter 28 is added to the linear signal component from amplifier/phase shifter 26 in an adder 34, while the nonlinear signal from amplifier/phase shifter 30 is subtracted from the linear signal component from amplifier/phase shifter 32 in an adder 36. In an analog embodiment adders 34, 36 may, for example, be realized as hybrids. In a digital embodiment they are digital adders. The amplitudes and phases of the output node voltages and output currents for this amplifier are shown in FIG. 17-20.

Figure 3:
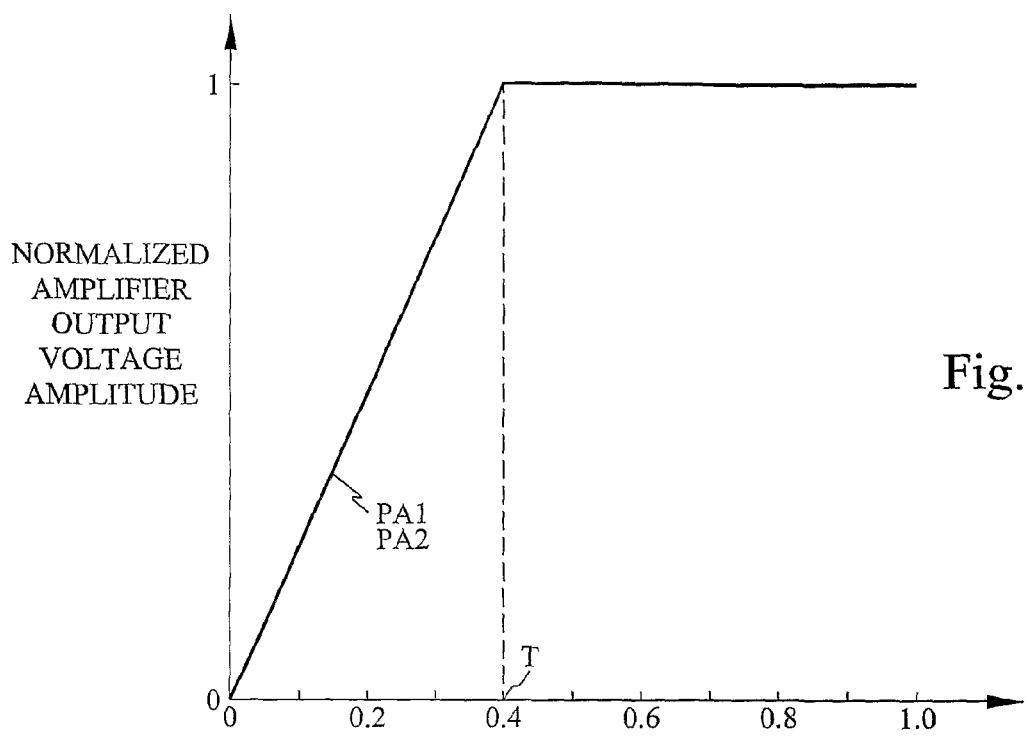
FIG. 3 is a diagram illustrating how the amplitude of the output voltage of the constituent amplifiers depends on the normalized Chireix amplifier output voltage.
Figure 4:
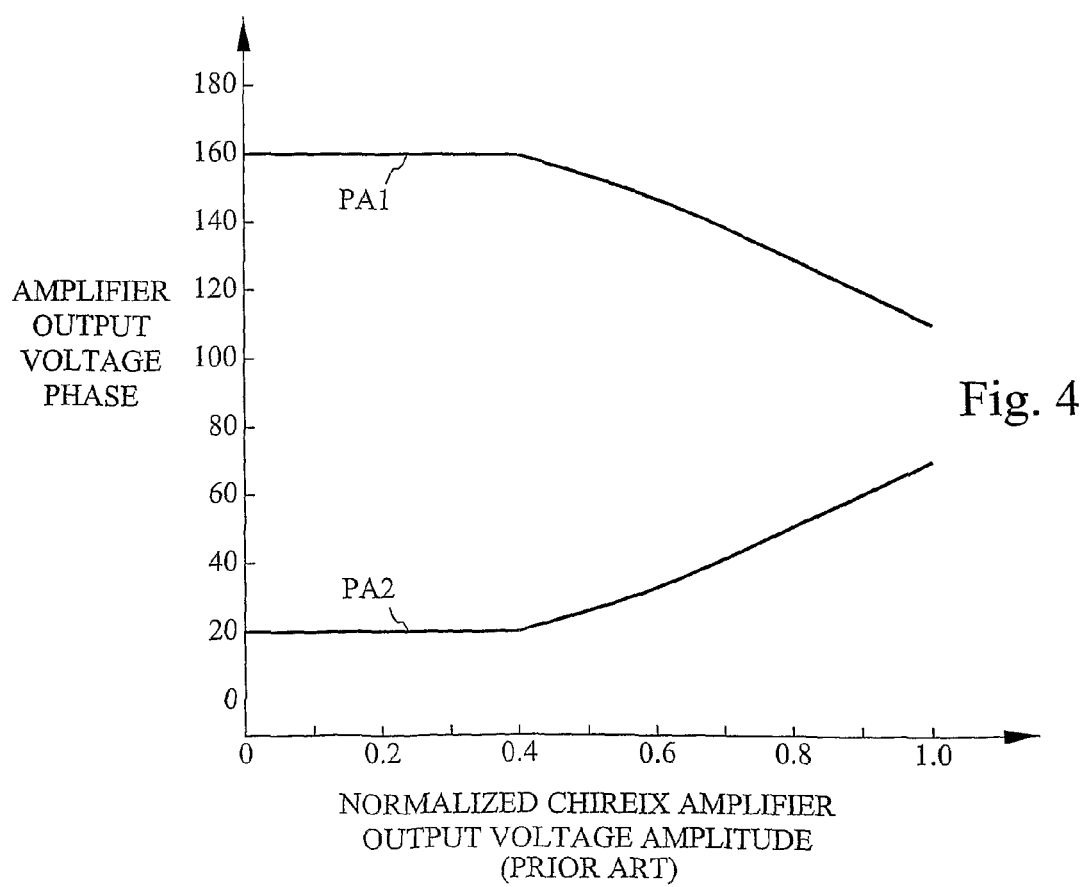
FIG. 4 is a diagram illustrating how the phase of the output voltage of the constituent amplifiers depends on the normalized Chireix amplifier output voltage.
Figure 5:
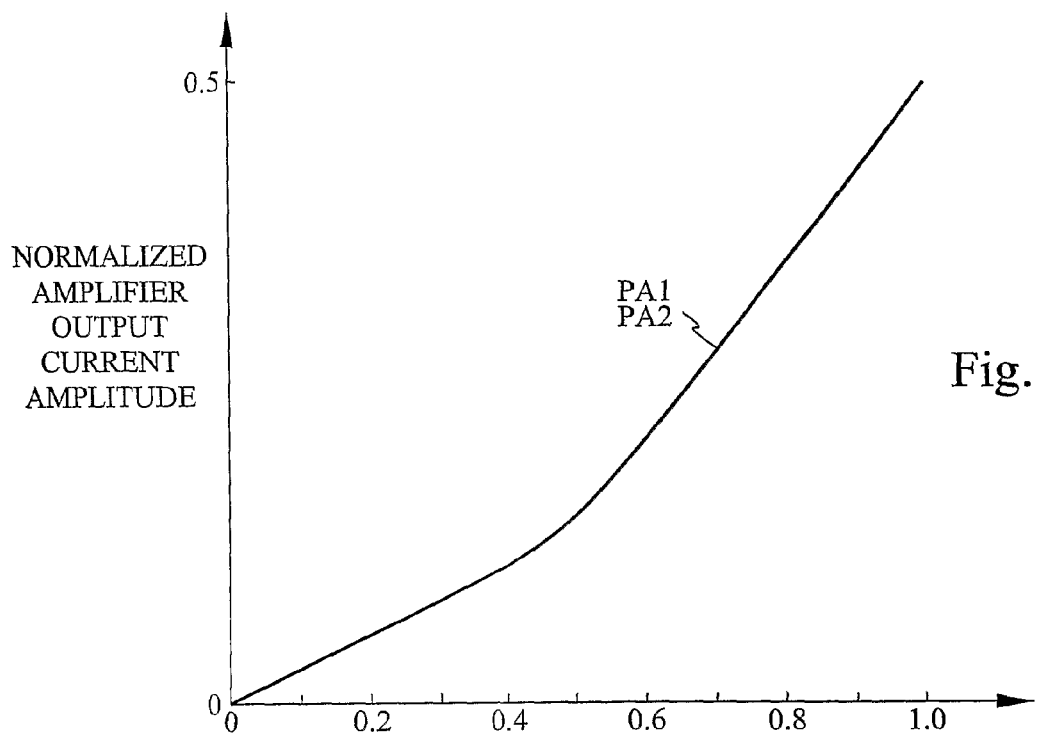
FIG. 5 is a diagram illustrating how the amplitude of the output current of the constituent amplifiers depends on the normalized Chireix amplifier output voltage.
Figure 6:
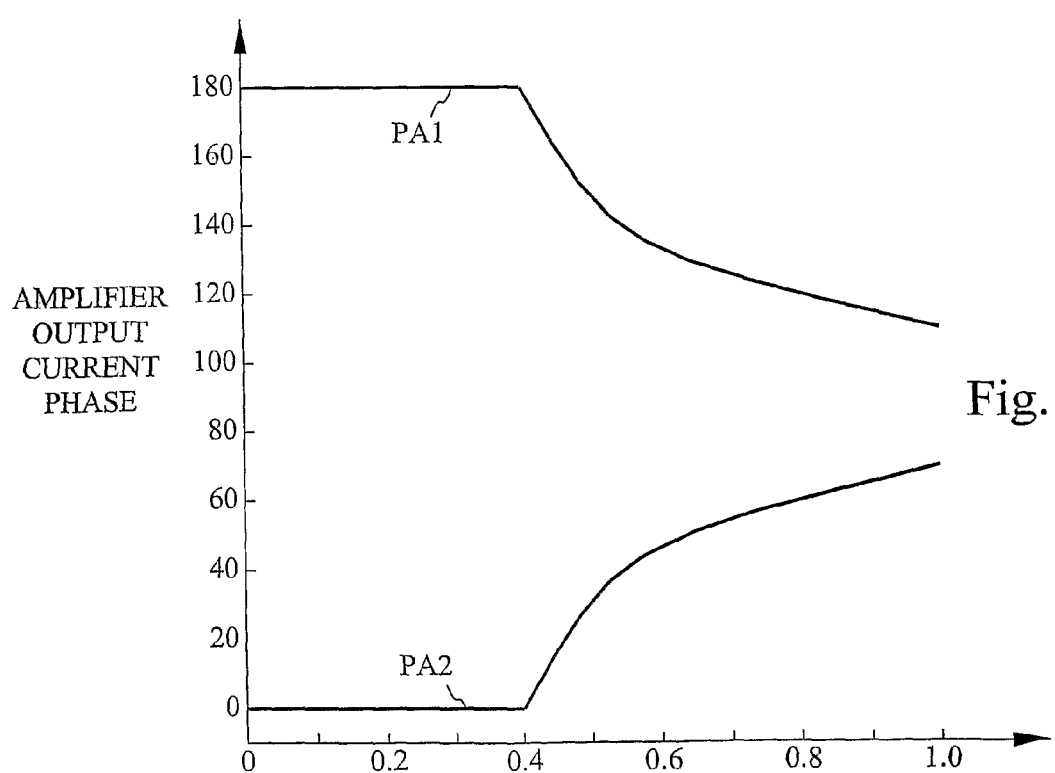
FIG. 6 is a diagram illustrating how the phase of the output current of the constituent amplifiers depends on the normalized Chireix amplifier output voltage.

Comparing with the Chireix amplifier behavior of FIG. 3, the characteristics of the new solution are shown in the voltage diagram as a faster rise in amplitude at the PA1 output node than at PA2 at low outputs. Above that, a region follows where PA1, but not PA2, is at constant voltage. An upper region of both amplifiers being at constant voltage is then used. The difference between this kind of operation and the state of the art operation of Chireix amplifiers [13], where both amplifiers have the same voltage amplitudes at all output levels, can be viewed as a replacement of the single transition point T with an intermediate or transition region limited by two transition points T1, T2.

Figure 18:
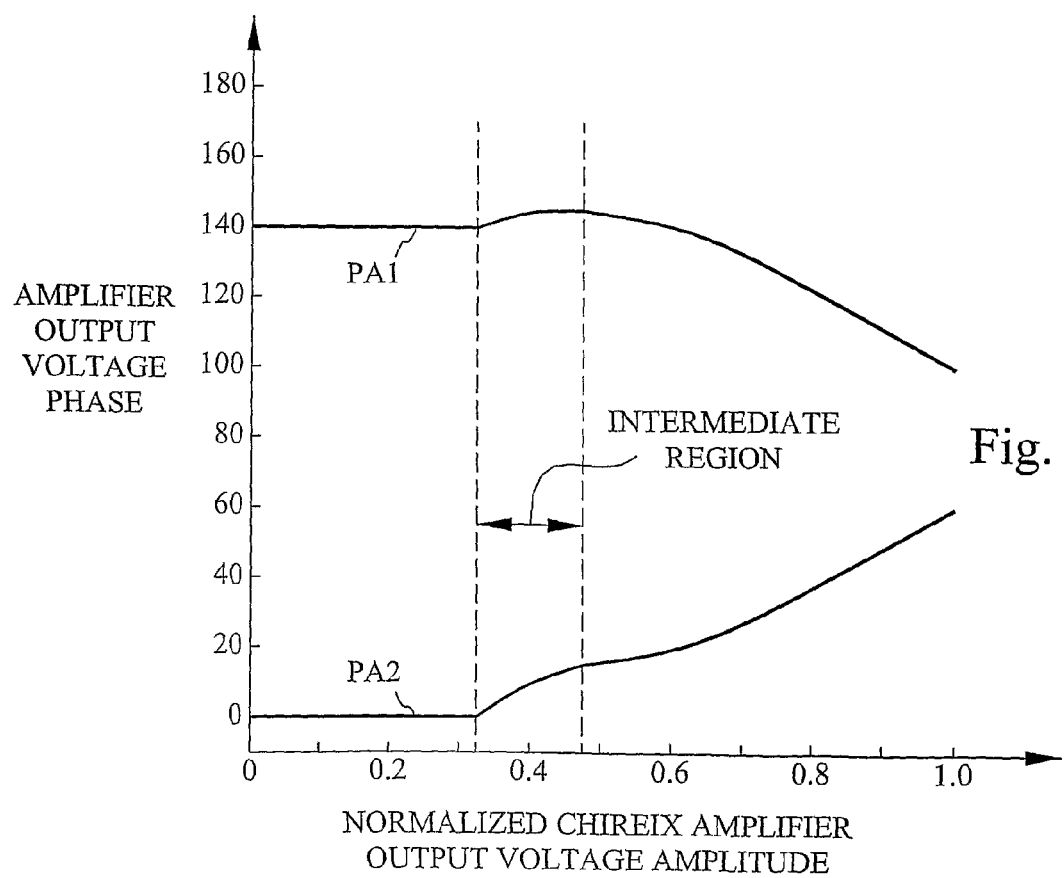
FIG. 18 is a diagram illustrating how the phase of the output voltage of the constituent amplifiers in FIG. 16 depends on the normalized Chireix amplifier output voltage.
Figure 19:
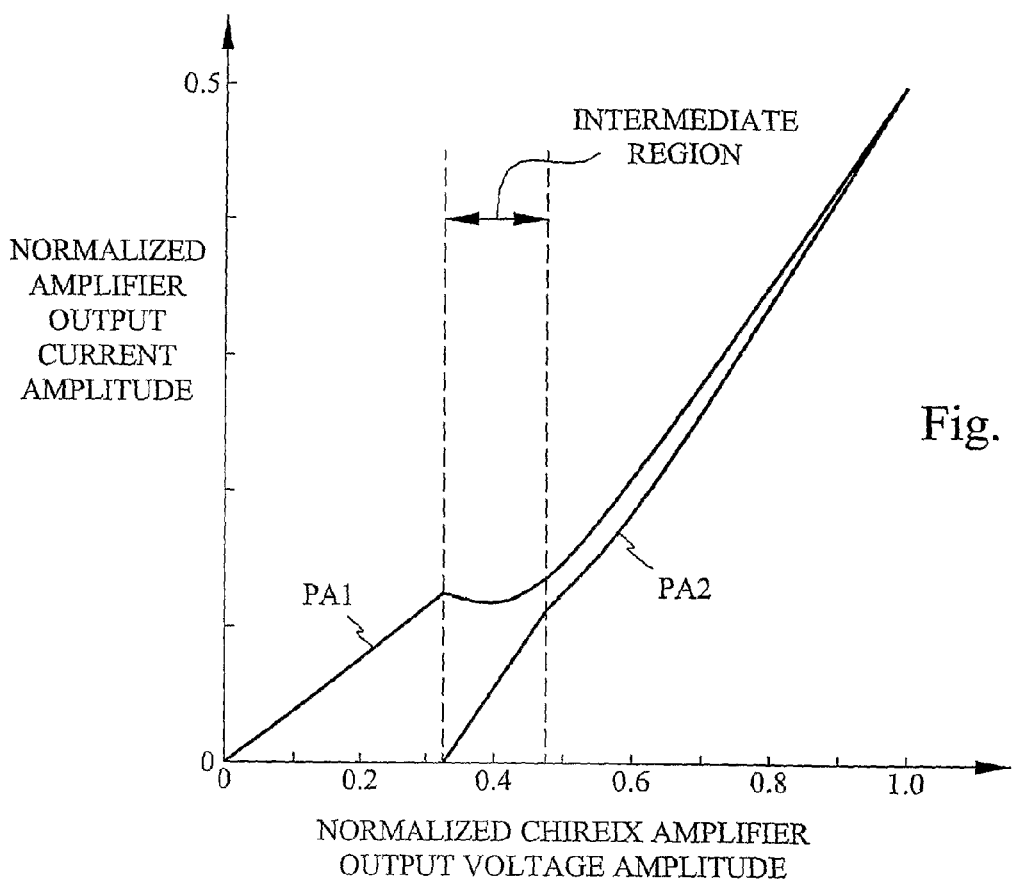
FIG. 19 is a diagram illustrating how the amplitude of the output current of the constituent amplifiers in FIG. 16 depends on the normalized Chireix amplifier output voltage.
Figure 20:
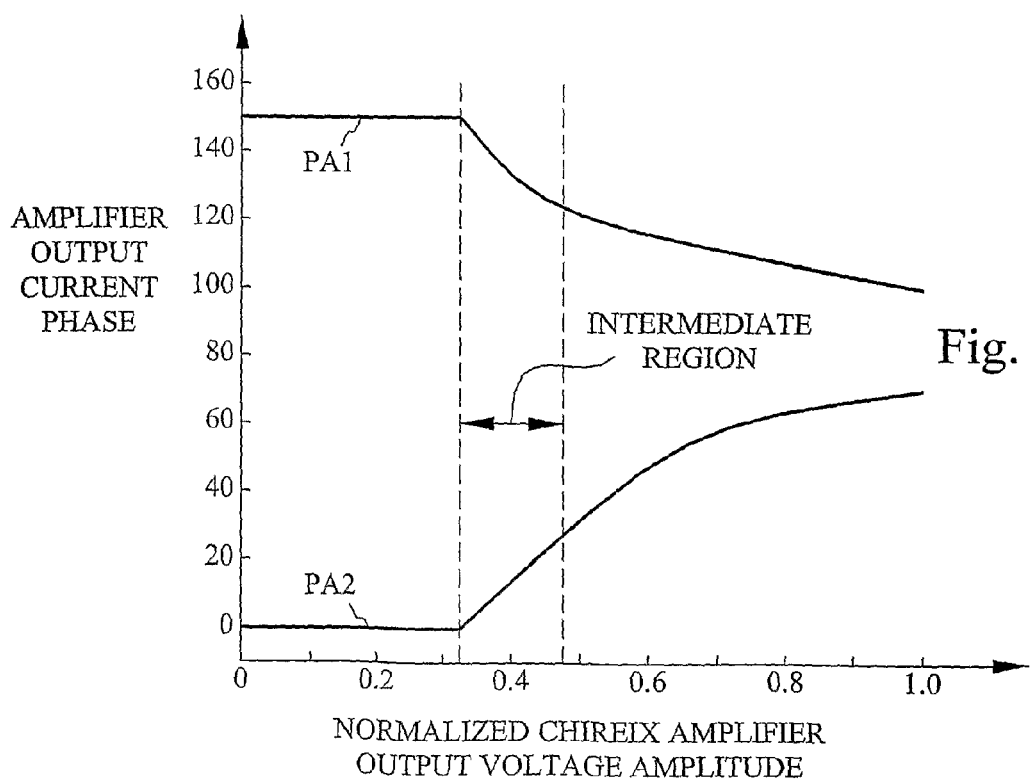
FIG. 20 is a diagram illustrating how the phase of the output current of the constituent amplifiers in FIG. 16 depends on the normalized Chireix amplifier output voltage.

Referring to FIG. 18, under low output operation, only PA1 supplies current. After PA1 goes into constant voltage operation, PA2 starts to deliver current, while PA1 in this case at first decreases its output current amplitude in this region. In the low output region there is also a phase "offset" compared to the Chireix amplifier.

Figure 21:
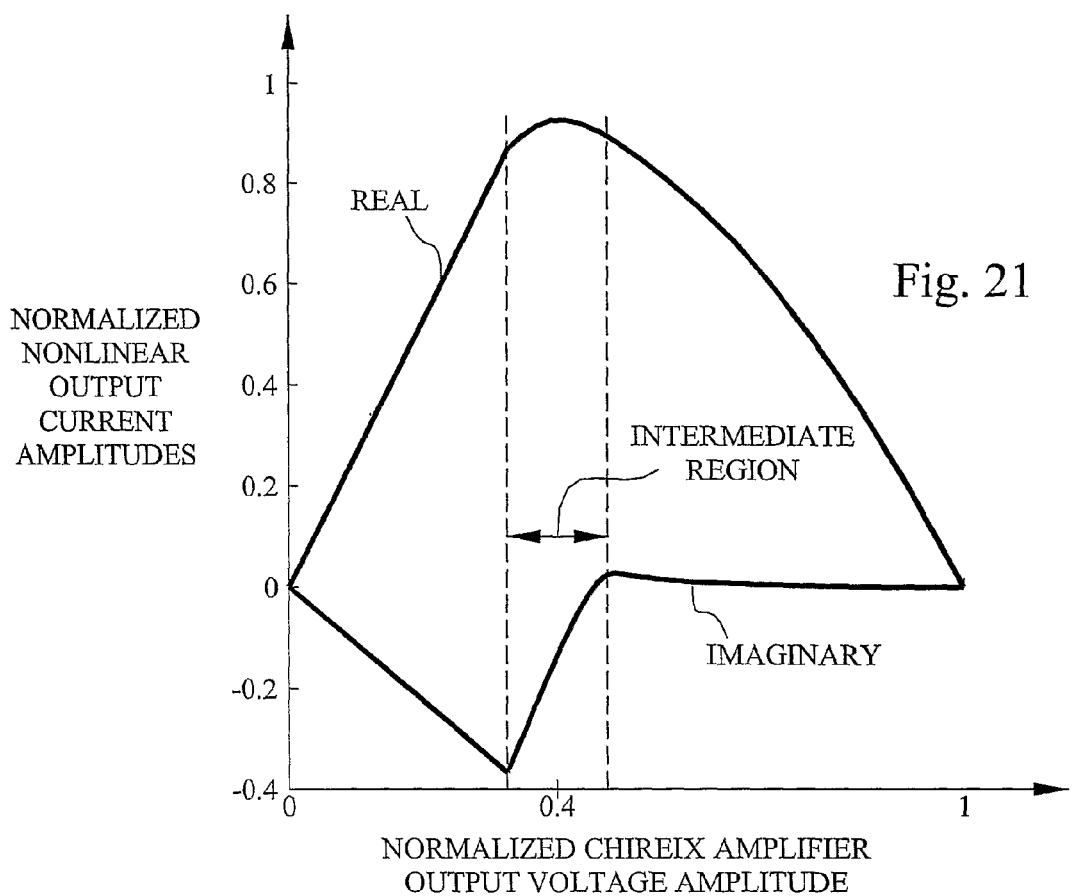
FIG. 21 is a diagram of the nonlinear function of the Chireix amplifier in FIG. 16.

Unlike the prior art nonlinear Chireix amplifier drive current function of FIG. 7, the detuned Chireix amplifier has an optimum nonlinear drive current function (in unit 38) that has a phase that varies with amplitude. This can be seen in FIG. 21 as a non-zero imaginary part. The two transitions with an intermediate region, instead of the single transition point for a tuned Chireix amplifier, can also be seen (indicated by the dashed lines) in this function.

Figure 22:
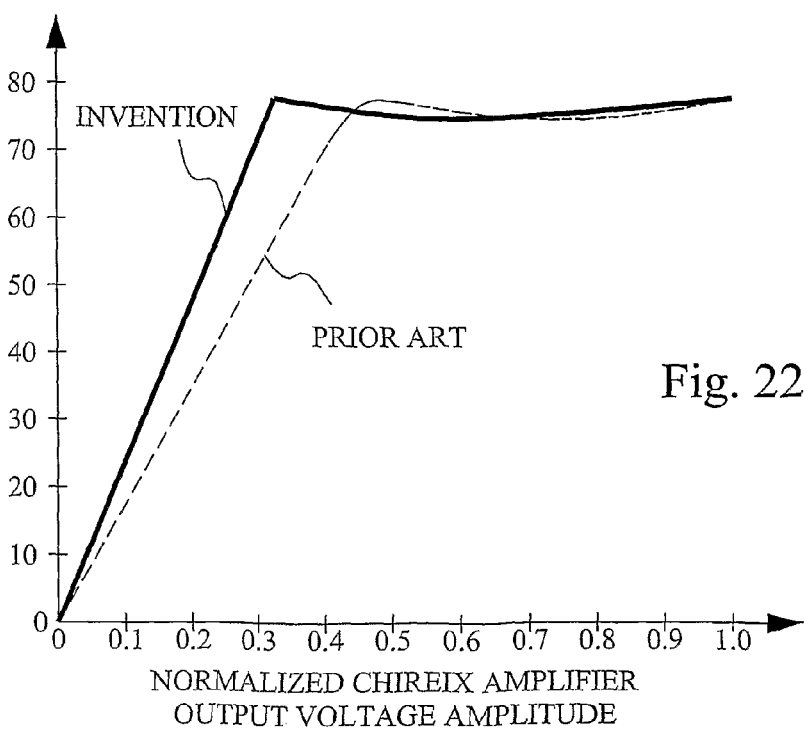
FIG. 22 is a diagram illustrating how the efficiency of the Chireix amplifier in FIG. 16 depends on the normalized Chireix amplifier output voltage.

The resulting efficiency curve has a shape that differs from that of the tuned Chireix amplifier, as can be seen in FIG. 22. The transition region widens (and lowers slightly) the lowest efficiency peak. The average efficiency can thus be higher, for certain common signal amplitude distributions, for a detuned Chireix amplifier than for an optimally designed modified (i.e. [13]) Chireix amplifier. The optimal amount of detuning (and of course the general dimensioning) of the amplifier depends on the input signal amplitude distribution at hand.

EXAMPLE 2

Detuned Doherty Amplifier

Figure 23:
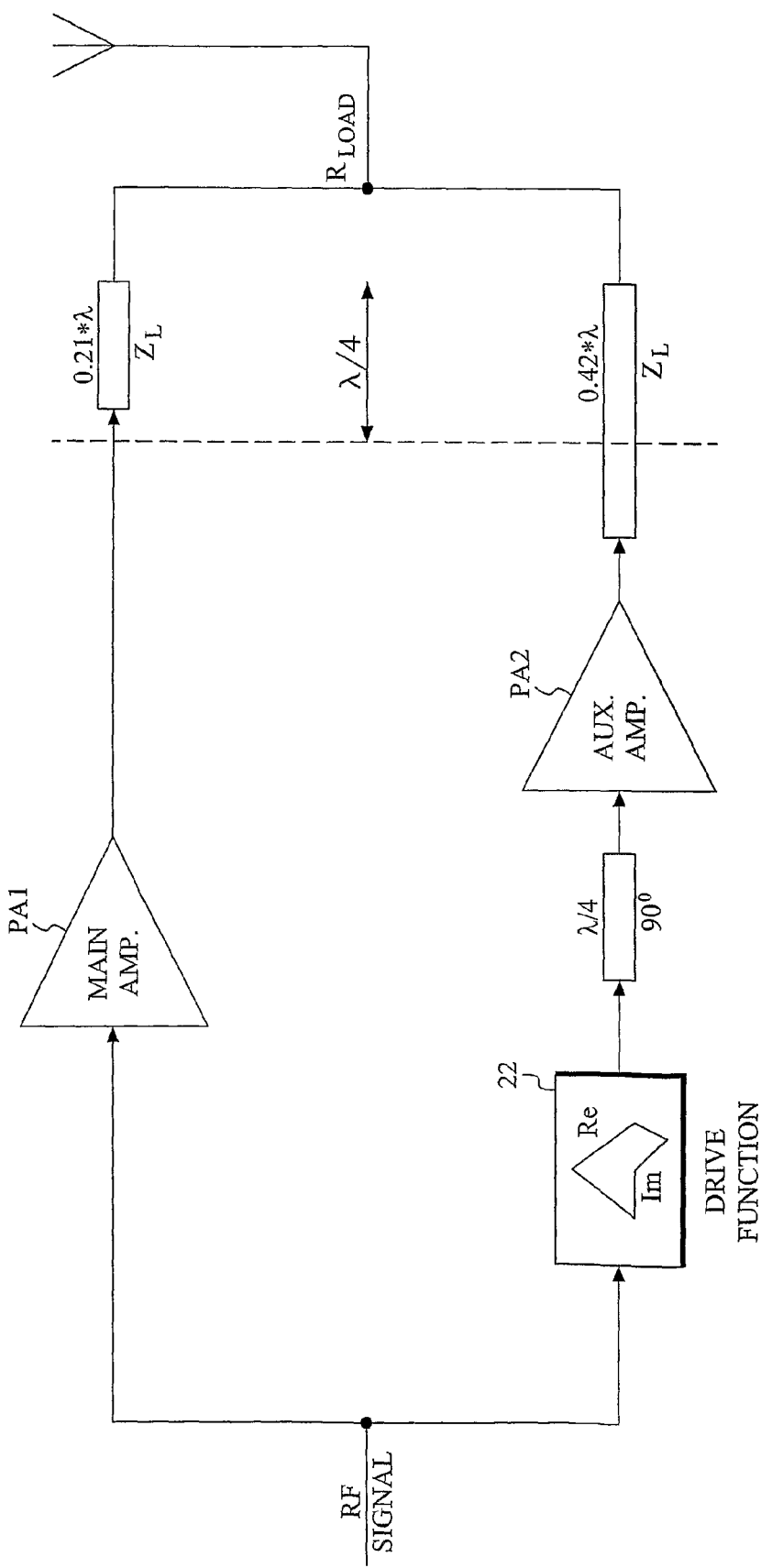
FIG. 23 is a block diagram of a detuned Doherty amplifier.

A Doherty amplifier can be built with transmission lines of λ/4 and λ/2 electrical length from the constituent amplifiers to the common output [16]. In the case presented here, such a Doherty amplifier is detuned to 19% below its nominal frequency. The lengths of the transmission lines are then instead 0.21λ (from PA1 to the common output) and 0.42λ (from PA2) which sums to 0.63λ. Such a detuned Doherty amplifier is illustrated in FIG. 23. The amplitudes and phases of the output node voltages and output currents for this amplifier are shown in FIG. 24-27.

Figure 24:
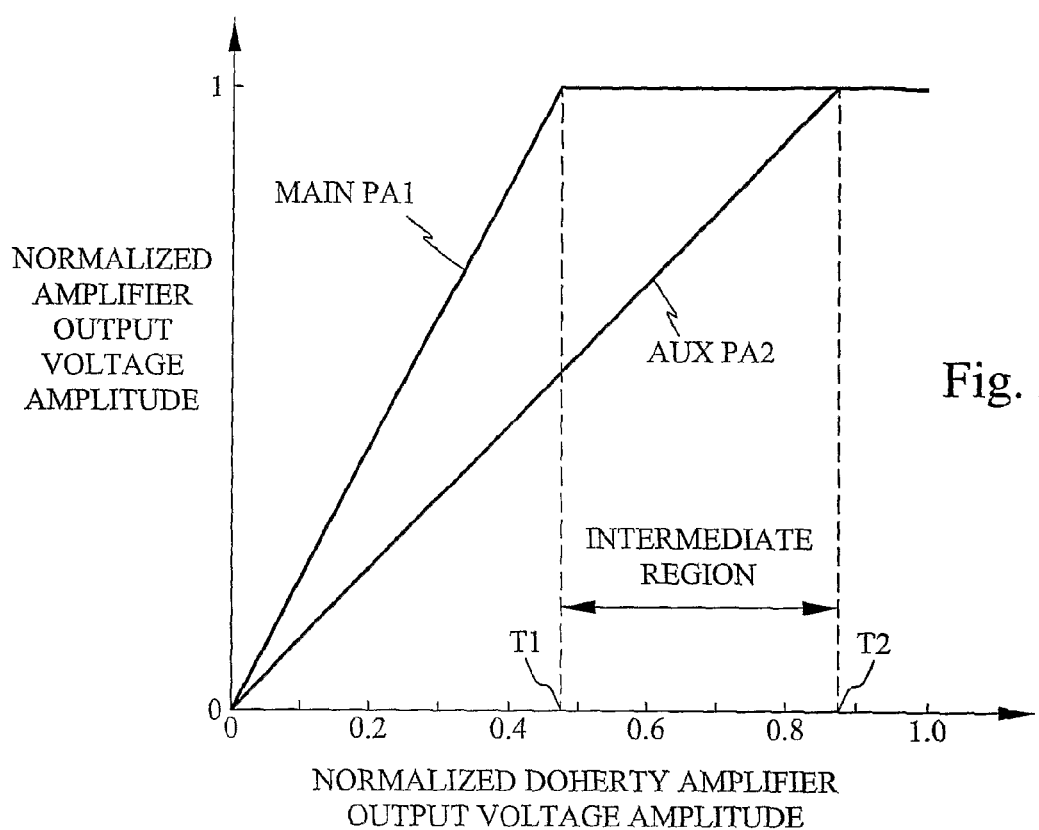
FIG. 24 is a diagram illustrating how the amplitude of the output voltage of the main and auxiliary amplifier, respectively, in FIG. 23 depends on the normalized Doherty amplifier output voltage.
Figure 25:
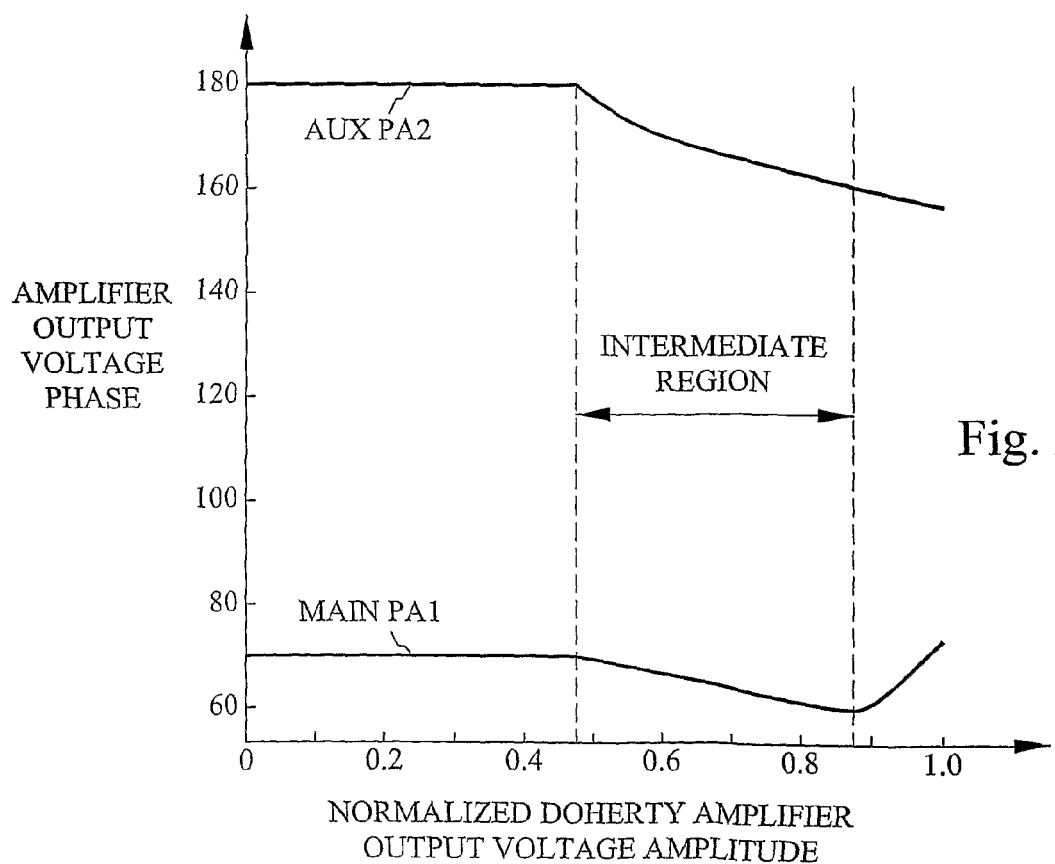
FIG. 25 is a diagram illustrating how the phase of the output voltage of the main and auxiliary amplifier, respectively, in FIG. 23 depends on the normalized Doherty amplifier output voltage.
Figure 26:
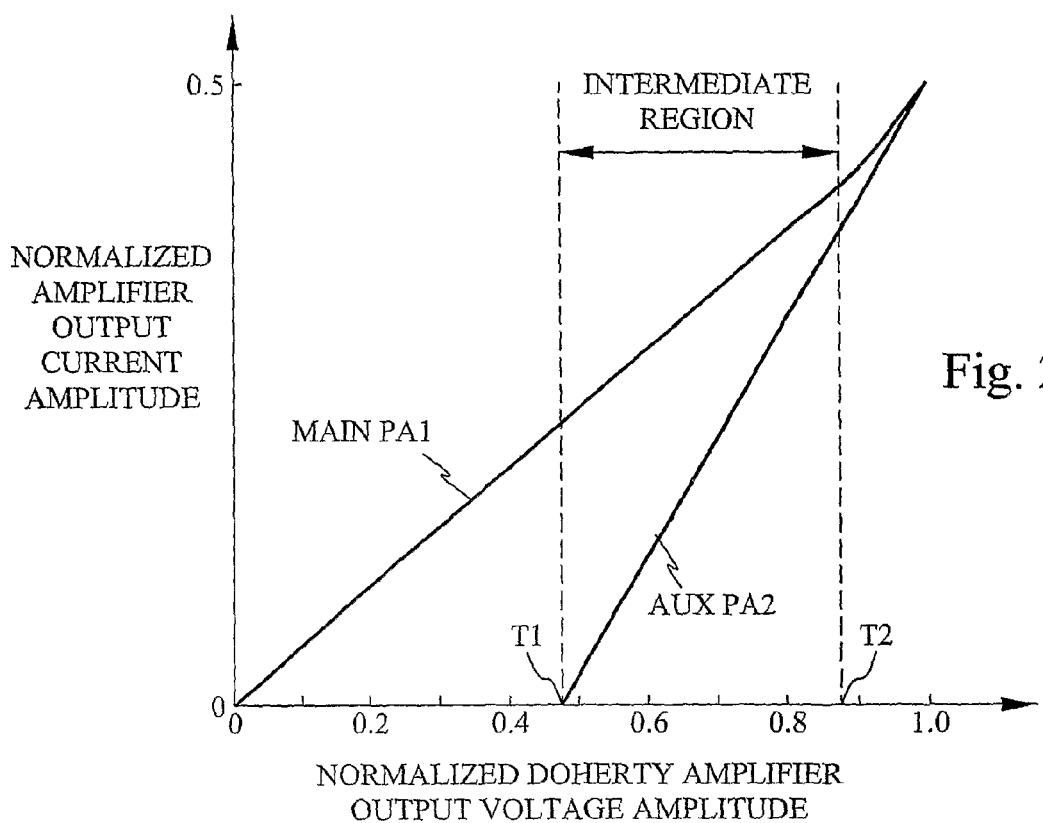
FIG. 26 is a diagram illustrating how the amplitude of the output current of the main and auxiliary amplifier, respectively, in FIG. 23 depends on the normalized Doherty amplifier output voltage.
Figure 27:
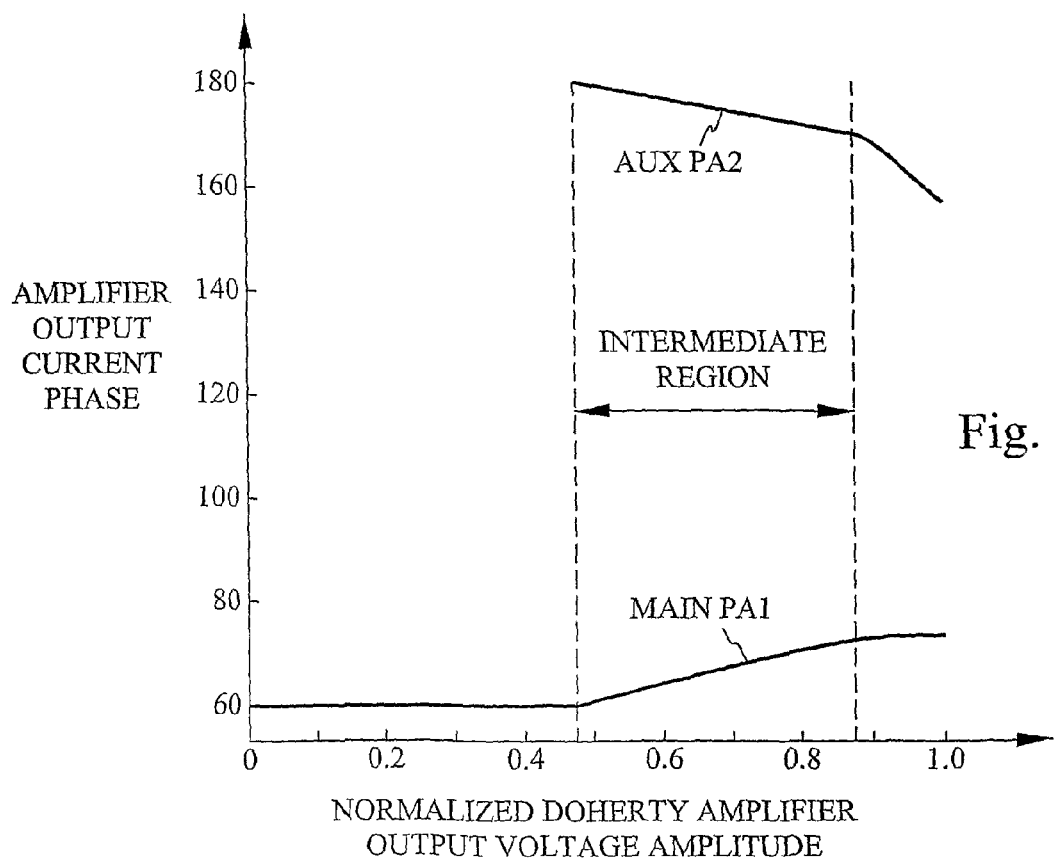
FIG. 27 is a diagram illustrating how the phase of the output current of the main and auxiliary amplifier, respectively, in FIG. 23 depends on the normalized Doherty amplifier output voltage.

Comparing with the Doherty amplifier of FIG. 9, the main characteristic of the new solution is shown in the voltage diagram of FIG. 24 as an intermediate or transition region in the upper end where both amplifiers are at constant voltage. As in the detuned Chireix case, this can be seen as the insertion of an extra transition point T2, but this time it is the top (maximum power) point that has been split. Notice that all the regions of the voltage diagram of the previously studied detuned Chireix are there, but with smaller or larger size. The currents illustrated in FIG. 26-27 are similar to those of the original Doherty amplifier, but have a region in the upper end where they run more quickly together.

In the top region a difference can be noticed between the present invention and regular outphasing, as used in Chireix amplifiers. As in outphasing, both amplifiers are at maximum voltage, but the phase changes of the currents or voltages generally are by different amounts at the different output nodes, as opposed to prior art outphasing. This effect is more visible in the detuned Doherty amplifier (see FIG. 24-27), than in the detuned Chireix amplifier (see FIG. 17-20).

Figure 28:
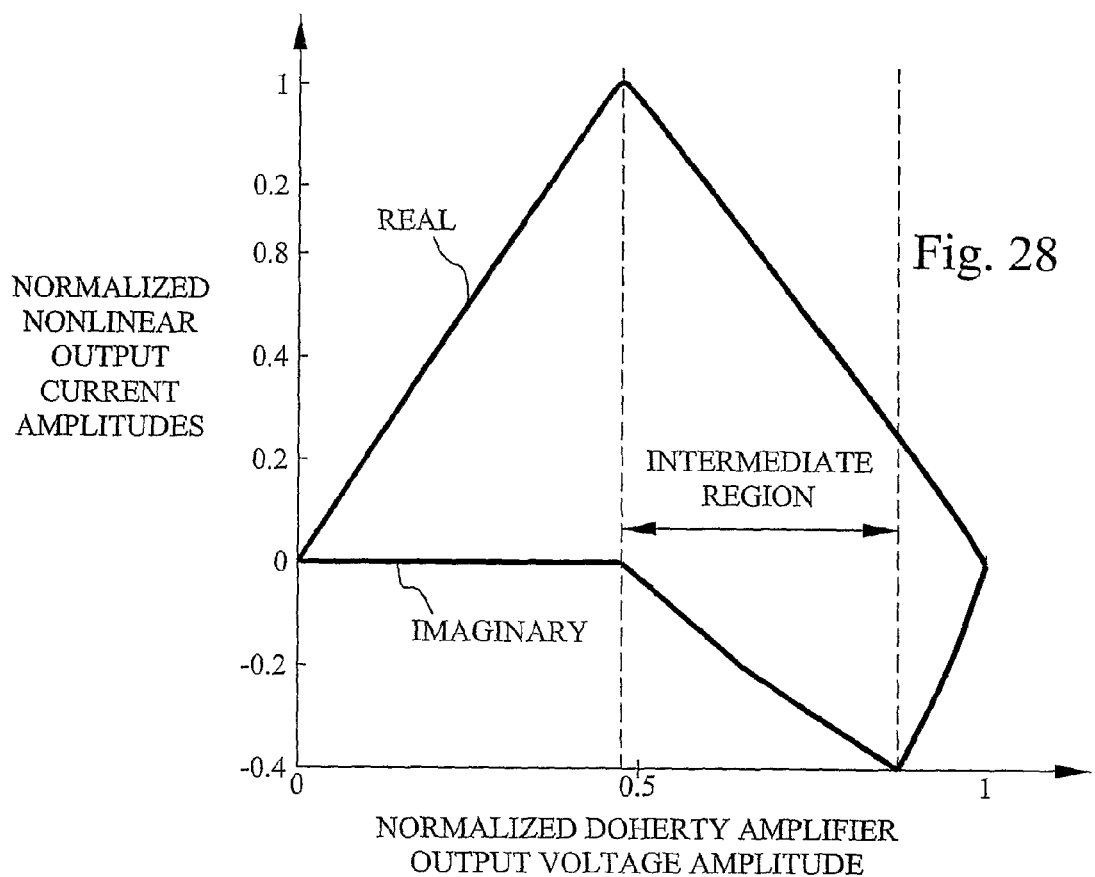
FIG. 28 is a diagram of the nonlinear function of the Doherty amplifier in FIG. 23.

Unlike the Doherty amplifier of FIG. 9, the detuned Doherty amplifier has an optimum nonlinear drive current function 22 that has a phase that varies with amplitude. This can be seen in FIG. 28 as a non-zero imaginary part. The two transitions T1, T2, instead of the single transition T of the Doherty amplifier, can also be seen in this function.

Figure 29:
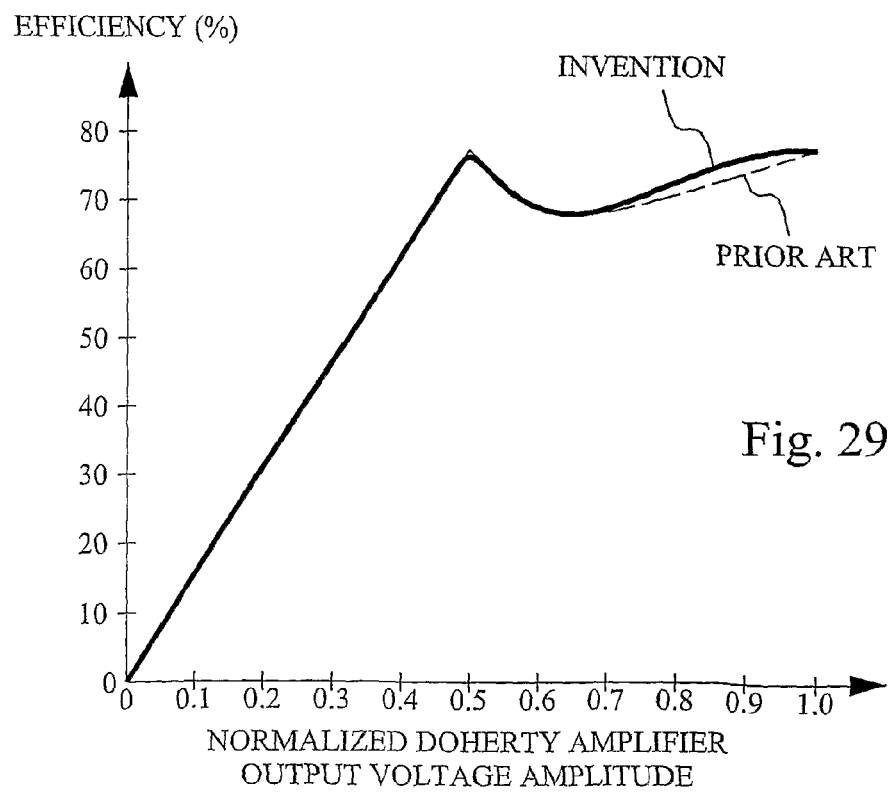
FIG. 29 is a diagram illustrating how the efficiency of the Doherty amplifier in FIG. 23 depends on the normalized output voltage.

The resulting efficiency curve has a shape that differs from that of the prior art Doherty amplifier mainly by having a Chireix-like uppermost region. The efficiency in this region is therefore increased compared to that of the original Doherty amplifier, while the efficiency peak at half of the maximum amplitude is largely unaffected. This is illustrated in FIG. 29.

EXAMPLE 3

Current Limitation at Low Outputs

Figure 30:
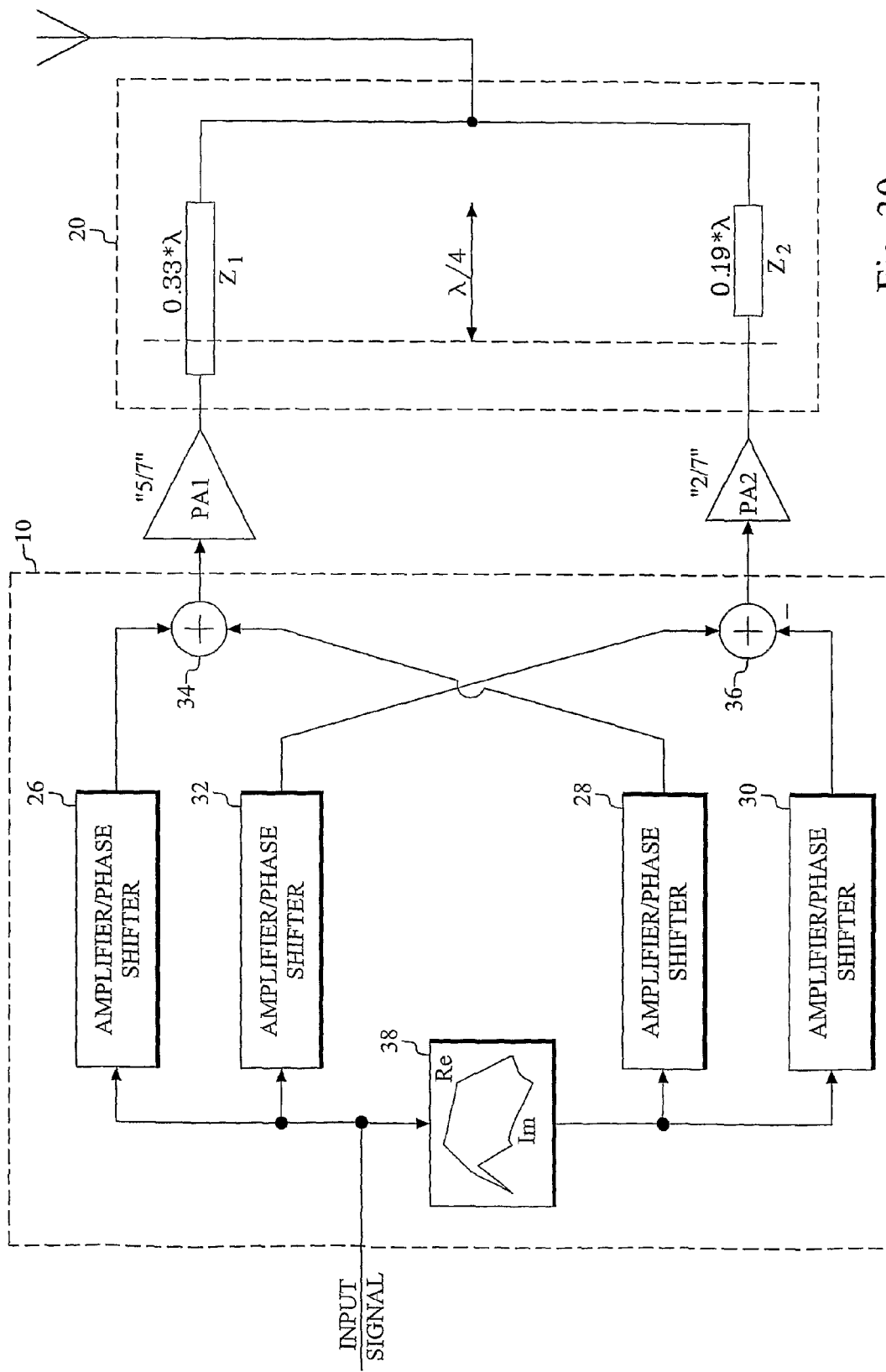
FIG. 30 is a block diagram of a Chireix amplifier with a current limitation at low output amplitudes.
Figure 31:
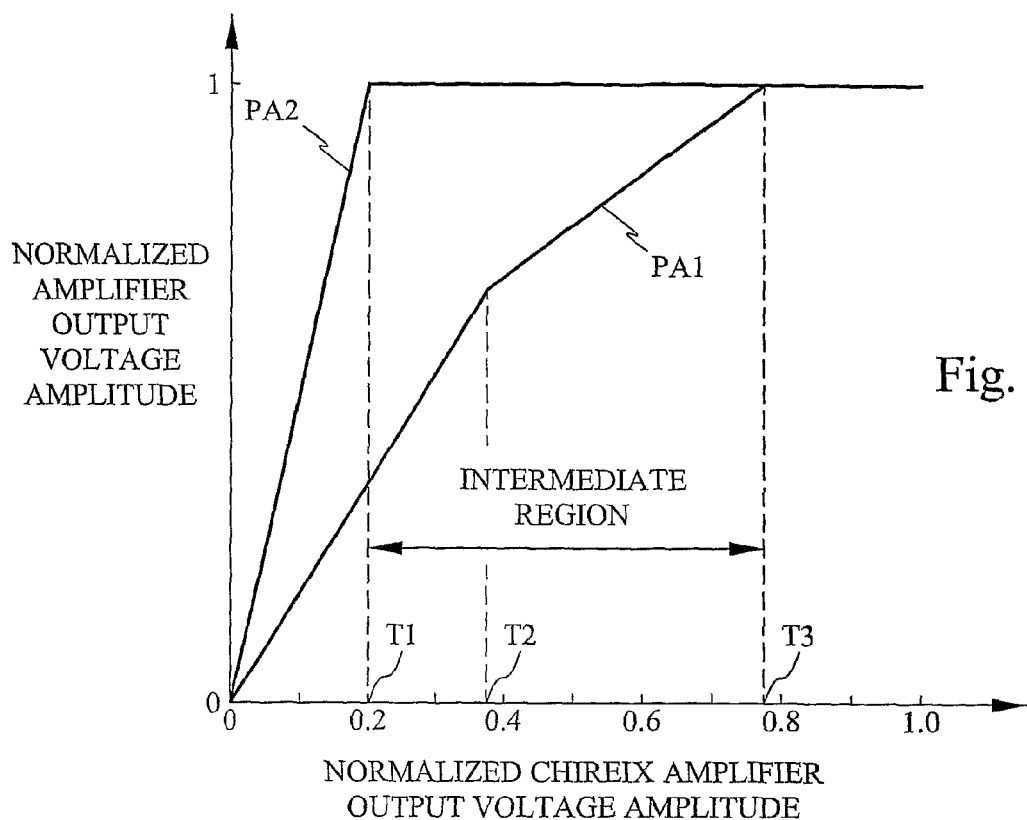
FIG. 31 is a diagram illustrating how the amplitude of the output voltage of the constituent amplifiers in FIG. 30 depends on the normalized Chireix amplifier output voltage.
Figure 32:
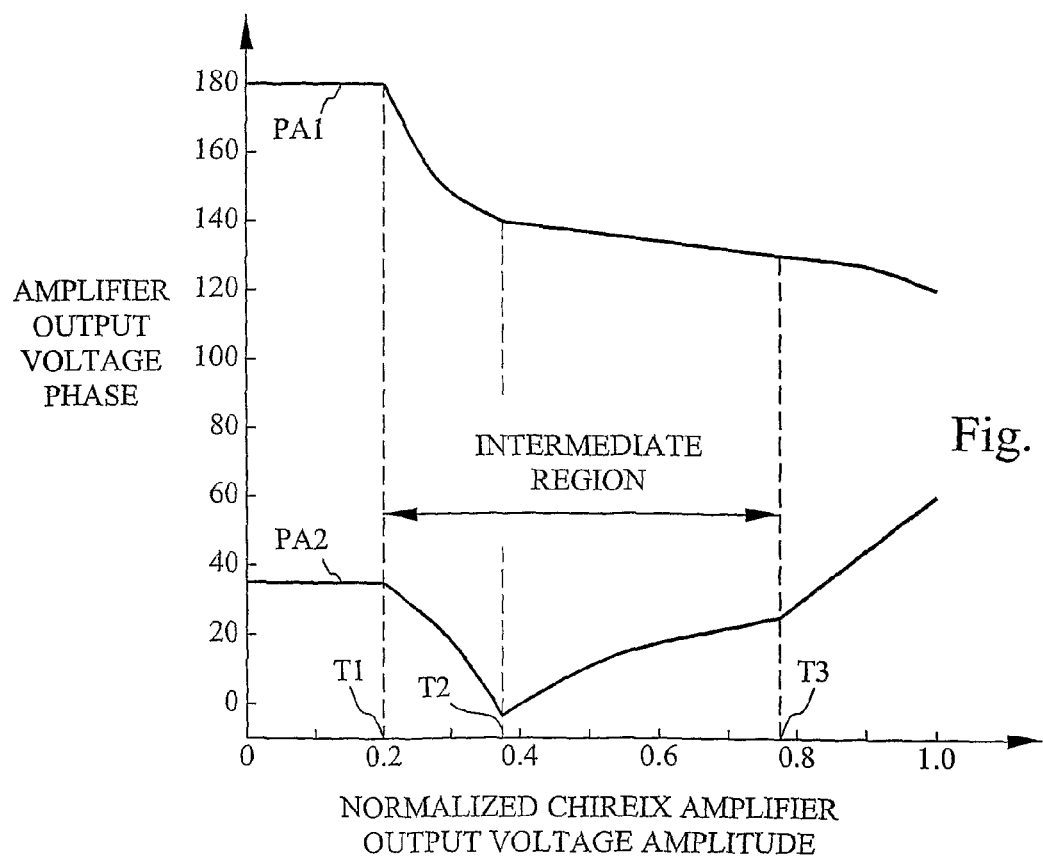
FIG. 32 is a diagram illustrating how the phase of the output voltage of the constituent amplifiers in FIG. 30 depends on the normalized Chireix amplifier output voltage.

This example of a detuned asymmetric (in transistor sizes) Chireix amplifier, illustrates the need for extra transition points, i.e. more regions with different operating conditions. The transmission line impedances are 1.4 (from PA1 to the common output) and 3.5 (from PA2) respectively. This means that the maximum output current from PA1 is 1/1.4=5/7 and from PA2 1/3.5=2/7. The line lengths, as illustrated in FIG. 30, are 0.33λ (from PA1 to the common output) and 0.19λ (from PA2) which sums to 0.52λ. The amplitudes and phases of the output node voltages and output currents for this amplifier are shown in FIG. 31-34.

Figure 33:
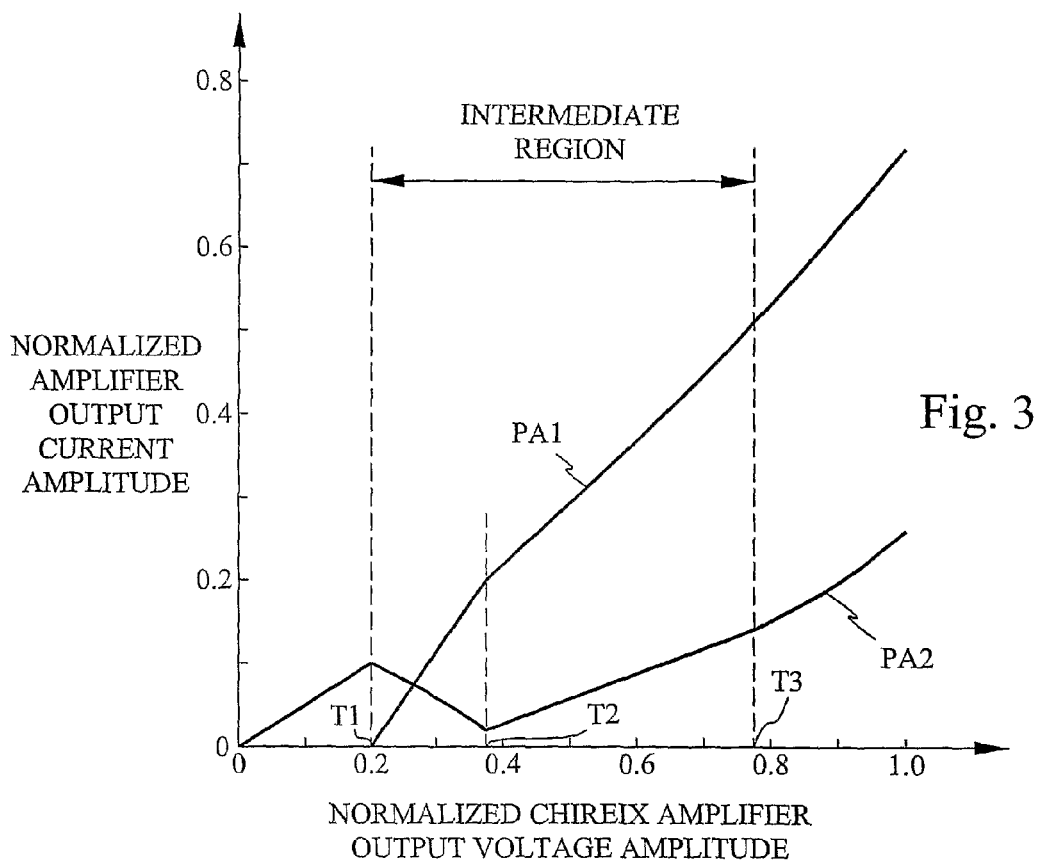
FIG. 33 is a diagram illustrating how the amplitude of the output current of the constituent amplifiers in FIG. 30 depends on the normalized Chireix amplifier output voltage.
Figure 34:
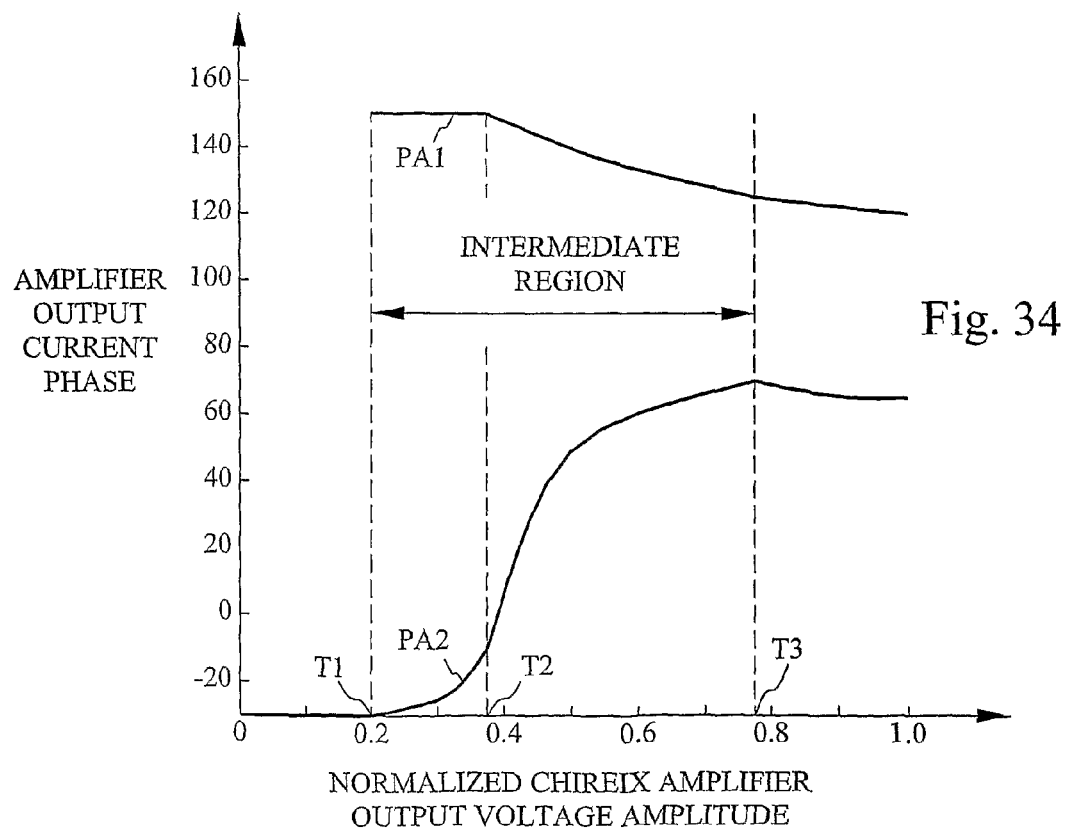
FIG. 34 is a diagram illustrating how the phase of the output current of the constituent amplifiers in FIG. 30 depends on the normalized Chireix amplifier output voltage.
Figure 35:
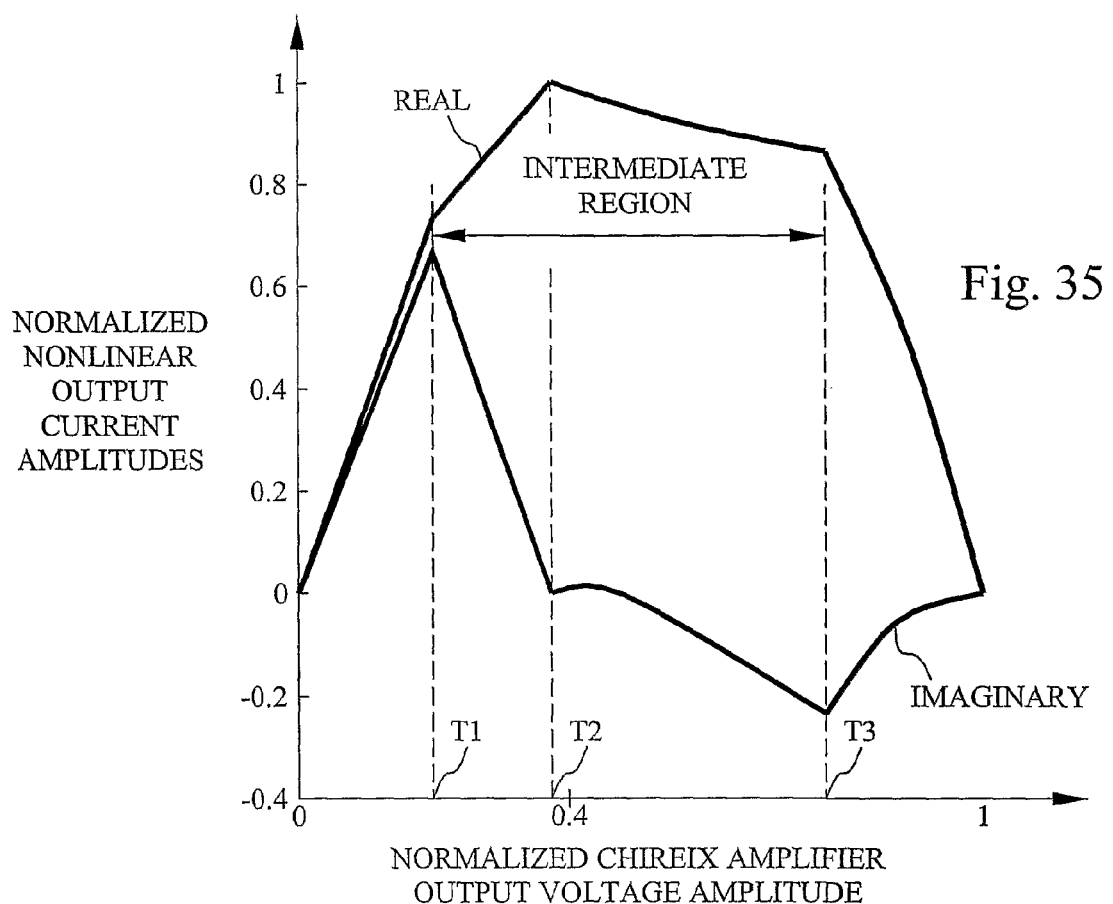
FIG. 35 is a diagram of the nonlinear function of the Chireix amplifier in FIG. 30.
Figure 36:
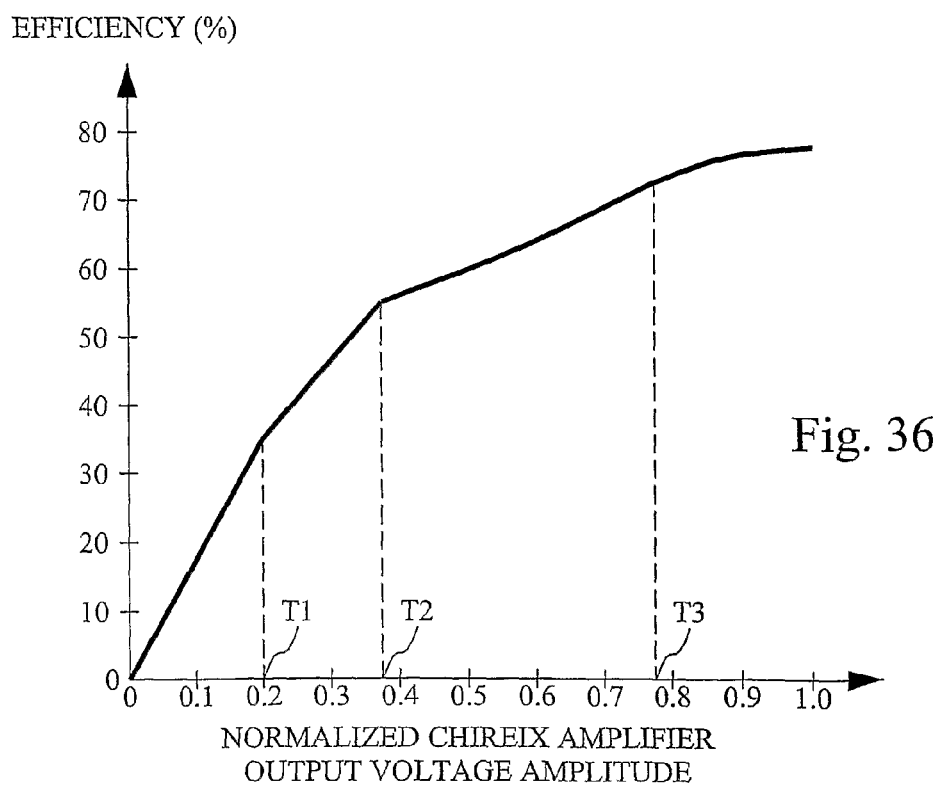
FIG. 36 is a diagram illustrating how the efficiency of the Chireix amplifier in FIG. 30 depends on the normalized Chireix amplifier output voltage.

The point of this example is to show the extra transition (at 0.36 of the maximum output voltage) that arises due to the current limitation at zero. As before, one amplifier (PA2) optimally takes care of the first region up to T1 by itself (FIG. 33). After this amplifier has reached its maximum output node voltage, the other amplifier (PA1) must contribute in the next region from T1 to T2. The optimal drive in this case requires the PA2 output current to decrease during this region, but when this current reaches zero, a transition T3 must occur. This transition, due to the fact that negative RF currents draw the same DC current as positive ones, is inside the region where one amplifier is at maximum voltage. The three transitions can also be seen in the decomposed nonlinear function illustrated in FIG. 35. They can also be noticed in the efficiency curve in FIG. 36.

EXAMPLE 4

Current Limitation at High Outputs

Figure 37:
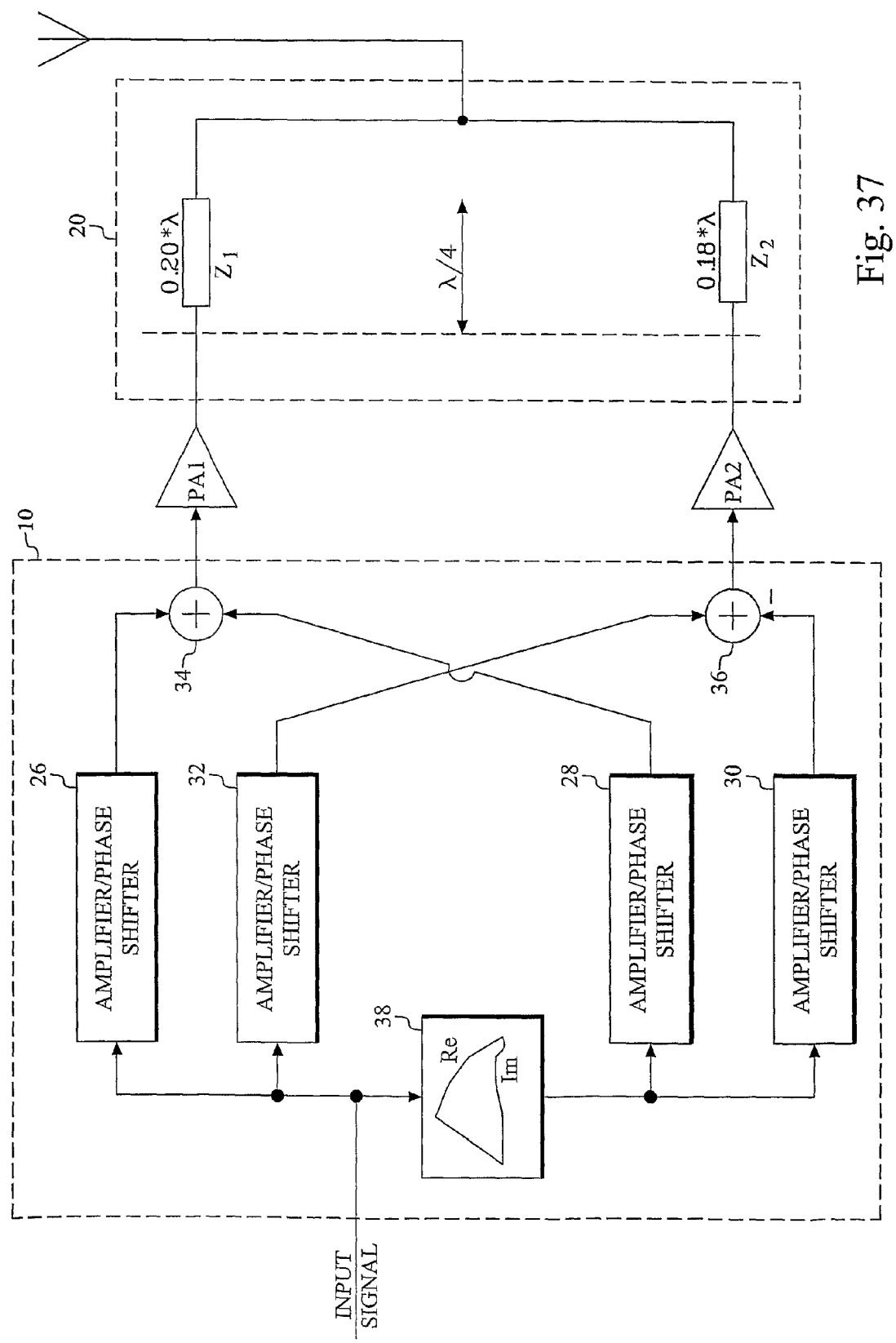
FIG. 37 is a block diagram of a Chireix amplifier with a current limitation at high output amplitudes.
Figure 38:
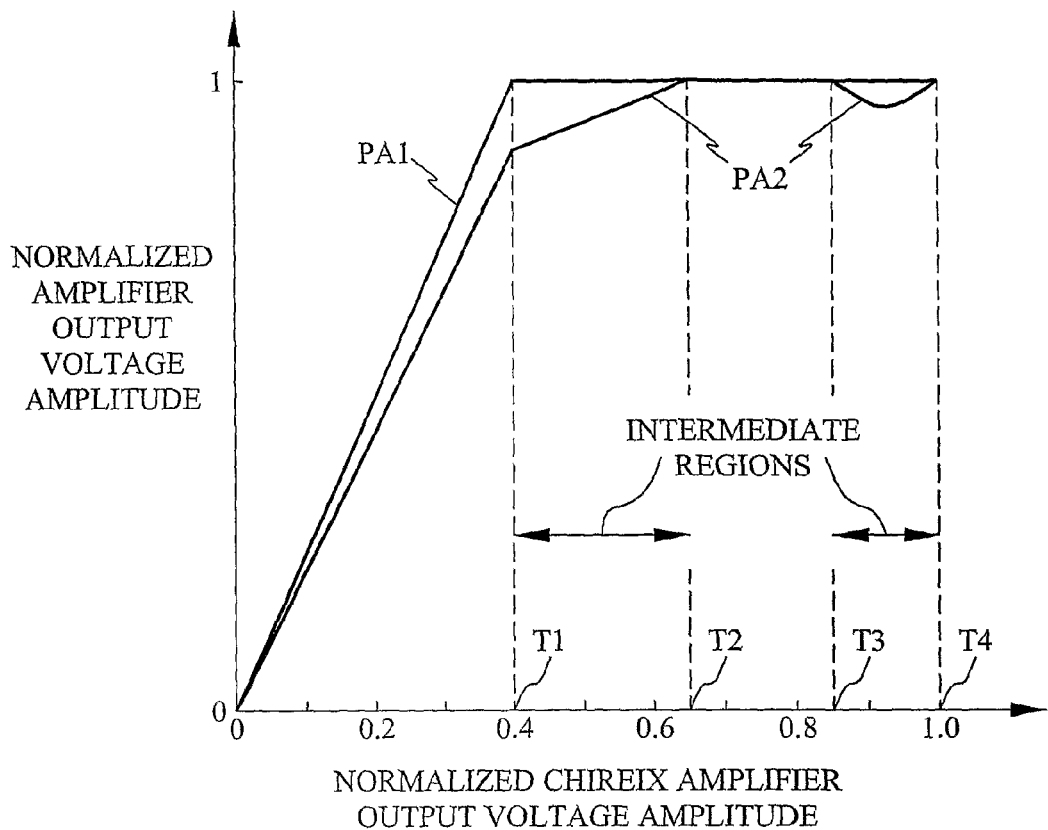
FIG. 38 is a diagram illustrating how the amplitude of the output voltage of the constituent amplifiers in FIG. 37 depends on the normalized Chireix amplifier output voltage.
Figure 39:
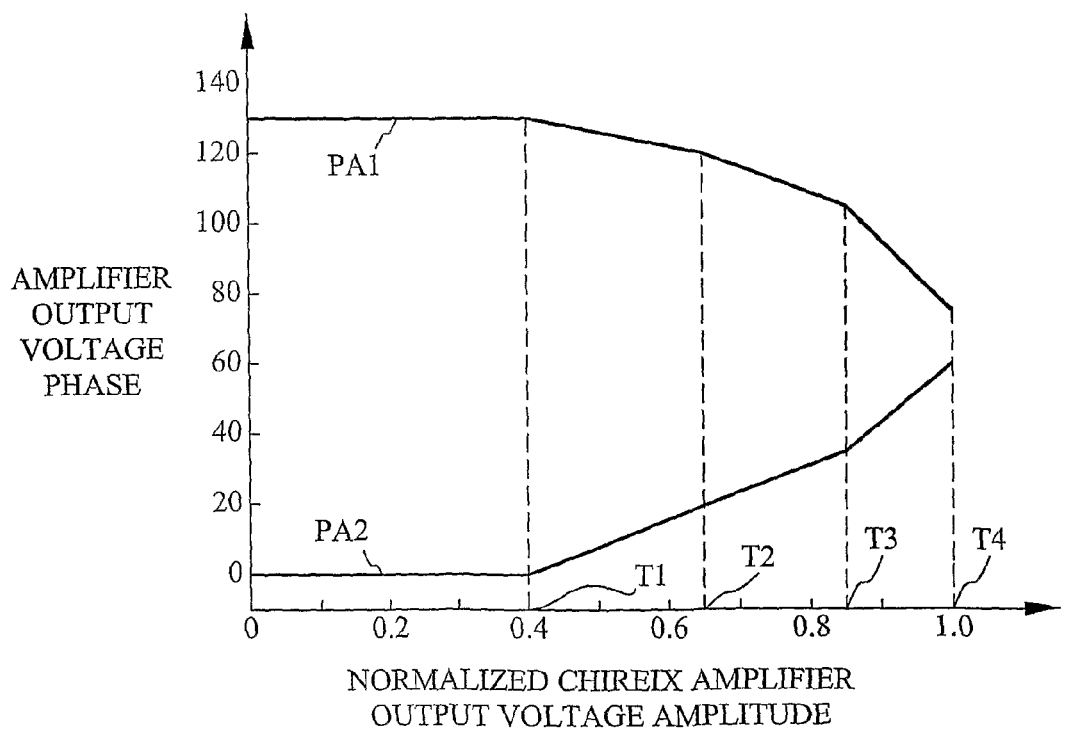
FIG. 39 is a diagram illustrating how the phase of the output voltage of the constituent amplifiers in FIG. 37 depends on the normalized Chireix amplifier output voltage.
Figure 40:
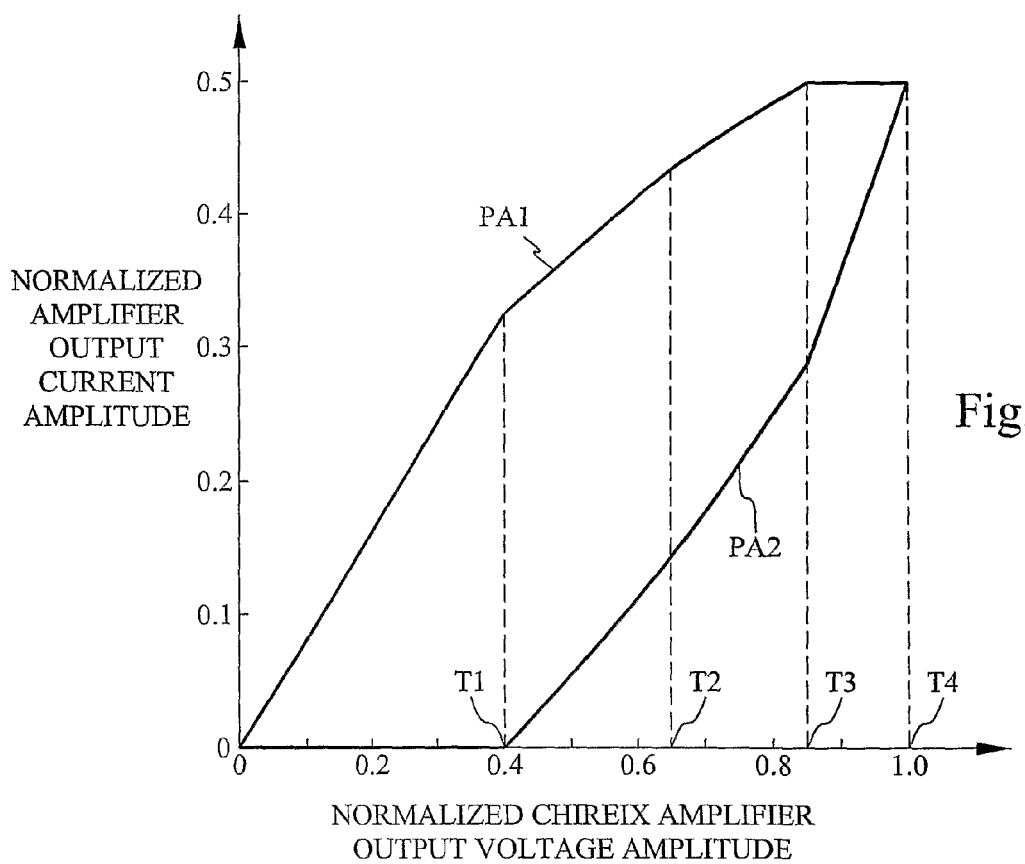
FIG. 40 is a diagram illustrating how the amplitude of the output current of the constituent amplifiers in FIG. 37 depends on the normalized Chireix amplifier output voltage.
Figure 41:
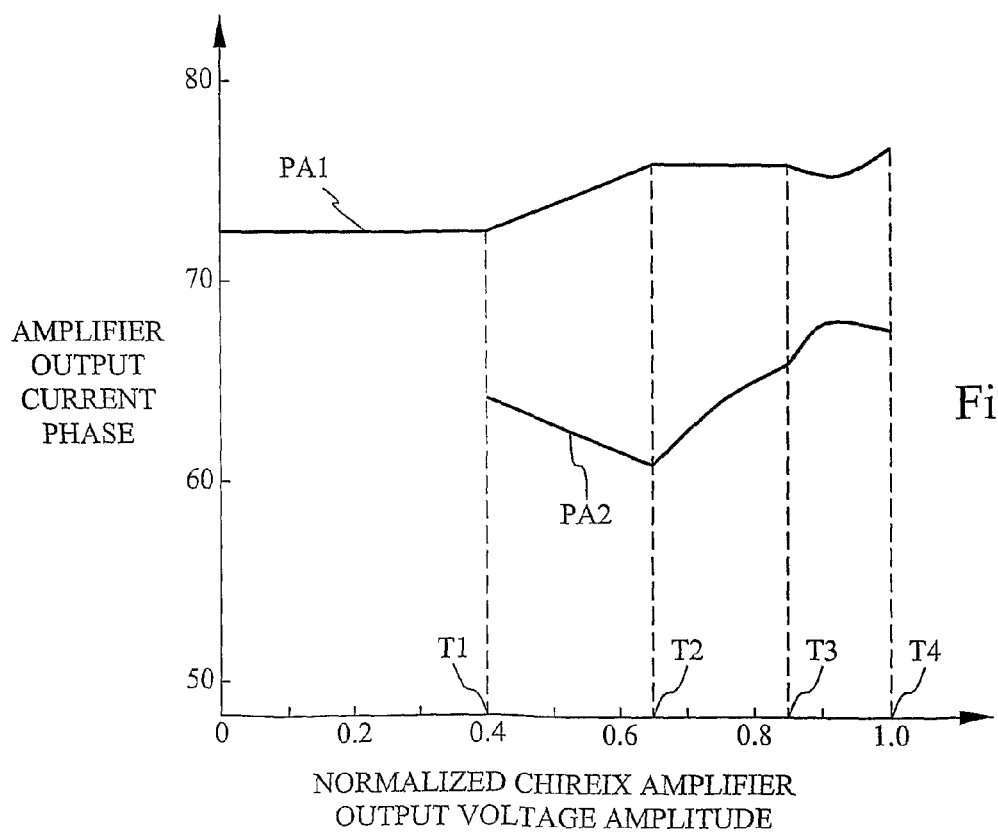
FIG. 41 is a diagram illustrating how the phase of the output current of the constituent amplifiers in FIG. 37 depends on the normalized Chireix amplifier output voltage.

In this example we have an amplifier that can be described as a very detuned symmetric Chireix amplifier originally designed for a low transition point. The example shows the need for extra transition points if a current limitation is encountered in optimal operation at high output voltages. The line lengths are here, as illustrated in FIG. 37, 0.20λ (from PA1 to the common output) and 0.18λ (from PA2) which sums to 0.38λ. The amplitudes and phases of the output node voltages and output currents for this amplifier are shown in FIG. 38-41.

Figure 42:
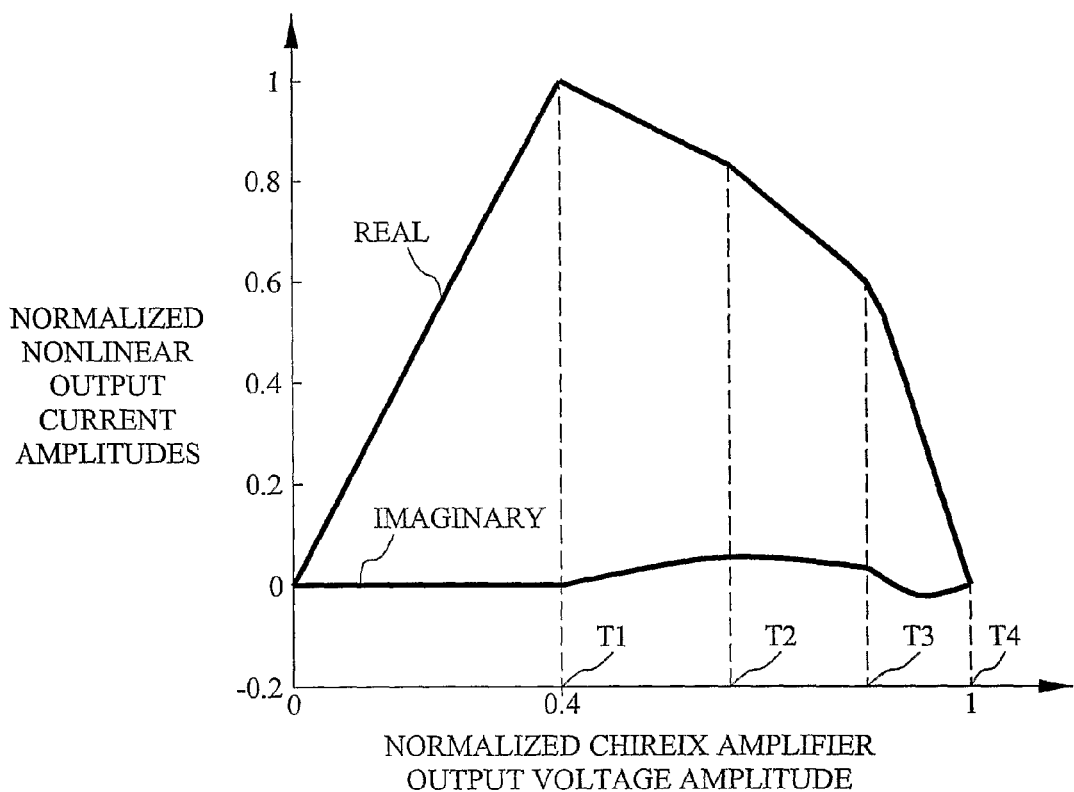
FIG. 42 is a diagram of the nonlinear function of the Chireix amplifier in FIG. 37.
Figure 43:
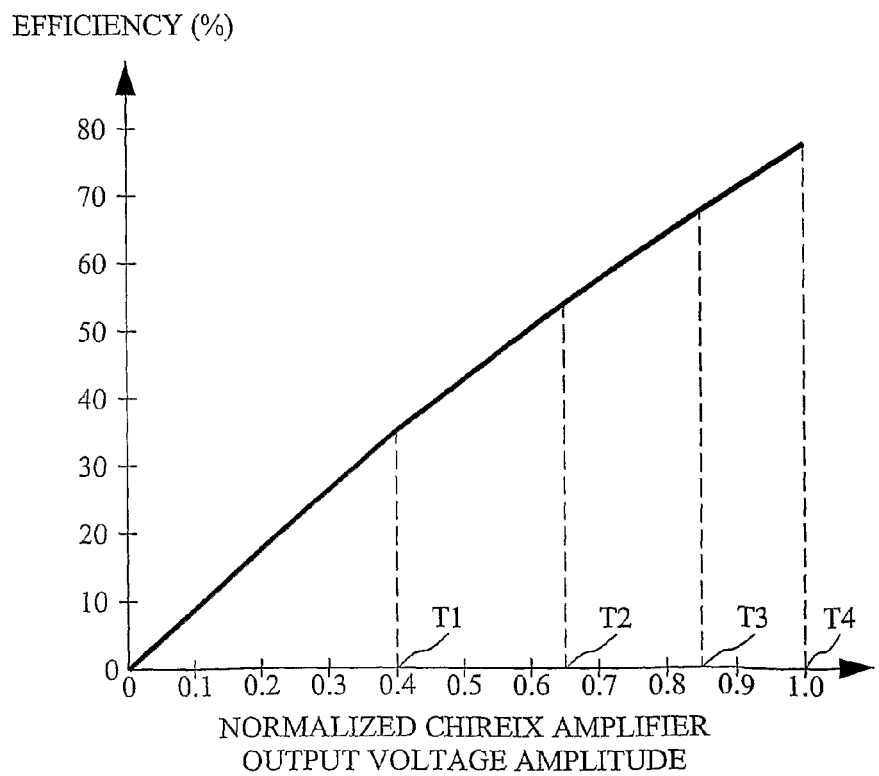
FIG. 43 is a diagram illustrating how the efficiency of the Chireix amplifier in FIG. 37 depends on the normalized Chireix amplifier output voltage.

The extra transition T3 (at 0.83 of the maximum output voltage) that arises due to the current limitation of PA1 is clearly seen in both the voltage plot and the current plot. In the region above this transition, the voltage at PA2 breaks away from its maximum, which was used in the region below. This can be seen as a splitting of the uppermost region (as described in the first three examples) into two regions. The decomposed nonlinear function for this amplifier is shown in FIG. 42. Efficiency-wise, this amplifier is only slightly better than a single amplifier class B stage, as can be seen in FIG. 43.

Although the embodiments described in examples 3 and 4 are not considered to be "good" amplifiers, they illustrate how the present invention can be used in special cases.

EXAMPLE 5

Detuned Chireix-Doherty Amplifier

Figure 44:
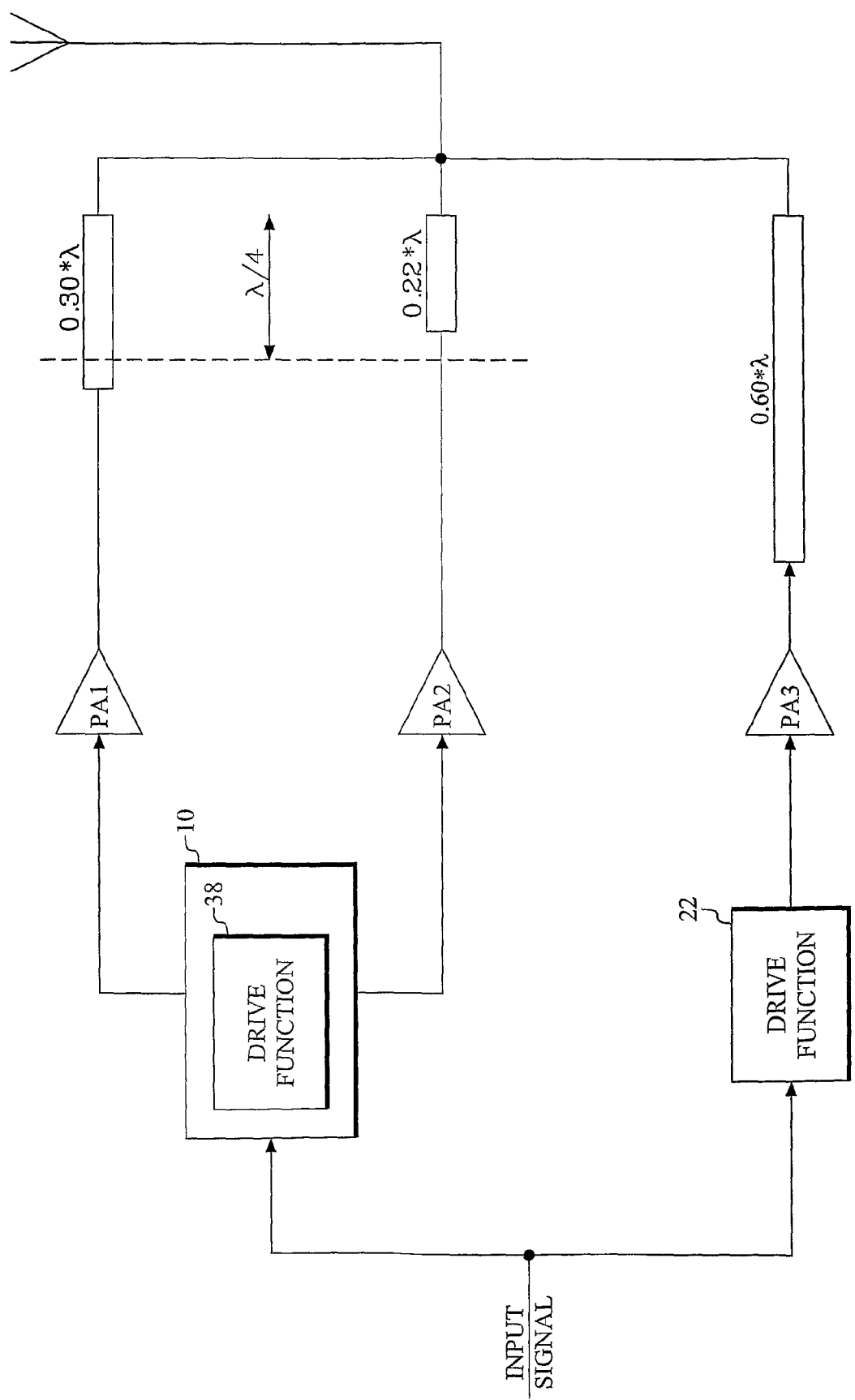
FIG. 44 is a block diagram of a detuned Chireix-Doherty amplifier.
Figure 45:
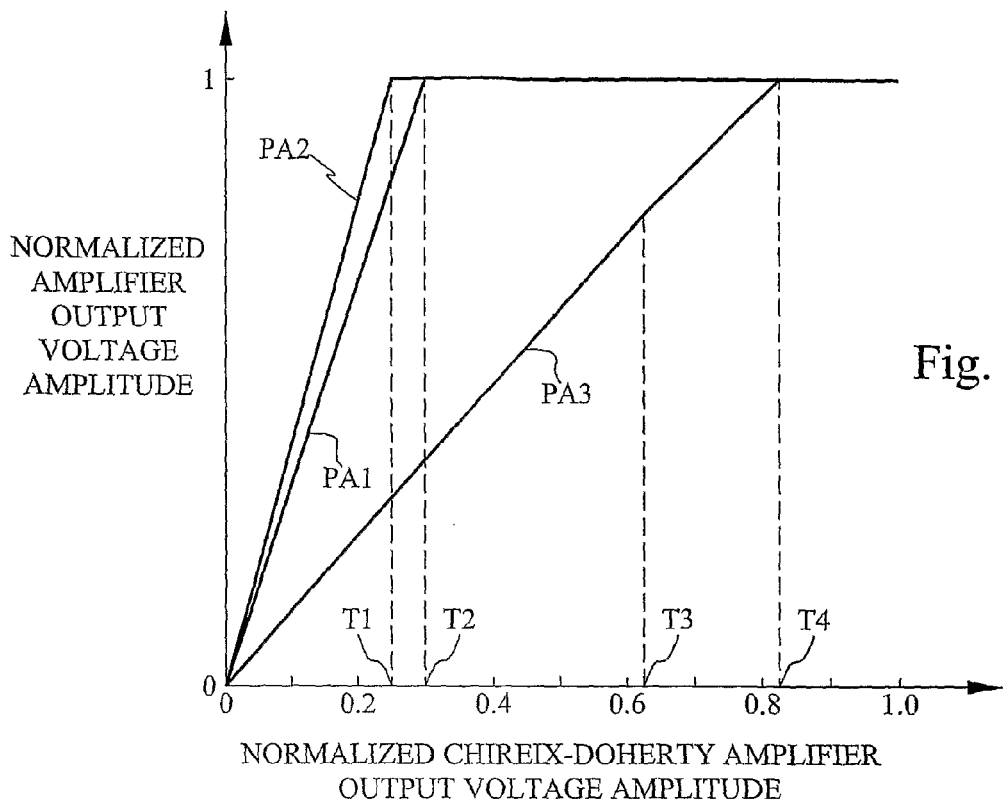
FIG. 45 is a diagram illustrating how the amplitude of the output voltage of the constituent amplifiers in FIG. 44 depends on the normalized Chireix-Doherty amplifier output voltage.
Figure 46:
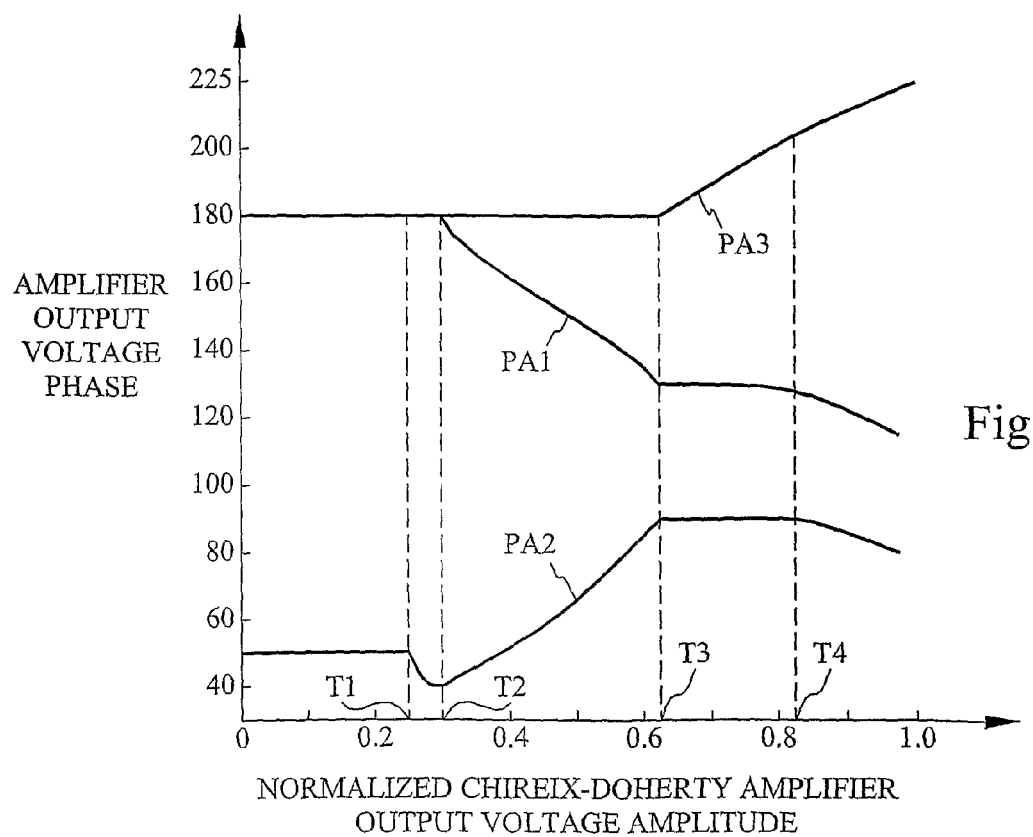
FIG. 46 is a diagram illustrating how the phase of the output voltage of the constituent amplifiers in FIG. 44 depends on the normalized Chireix-Doherty amplifier output voltage.

This example shows how to extend the solution to higher-order amplifier systems [17, 18, 19] by example of a three-transistor amplifier having Chireix properties at low output voltages and Doherty properties at high output voltages [18]. The amplifier consists of three equal transistors, coupled with equal impedance transmission lines to a common output. The transmission line lengths are: 0.30λ from the PA1 transistor, 0.22λ from PA2 and 0.60λ from PA3 to the output, as illustrated in FIG. 44. The first two transistors constitute a detuned Chireix pair (4% above the ordinary Chireix operating frequency) and the third constitutes the "Doherty part" of the amplifier (detuned to 20% above its ½ frequency). The amplitudes and phases of the output node voltages and output currents for this amplifier are shown in FIG. 45-48. In these plots we can observe both the behavior of the detuned Chireix, described in the first example, and that of the detuned Doherty from the second example. In the highest region, where all amplifiers are at maximum voltage, PA3 is "outphased" (in the widest sense) against the two other amplifiers, as seen in the phase plot. The detuned Chireix behavior is seen mainly in the appearance of a transition region instead of the original single transition point at 0.25-0.3 of the maximum output voltage.

Figure 49:
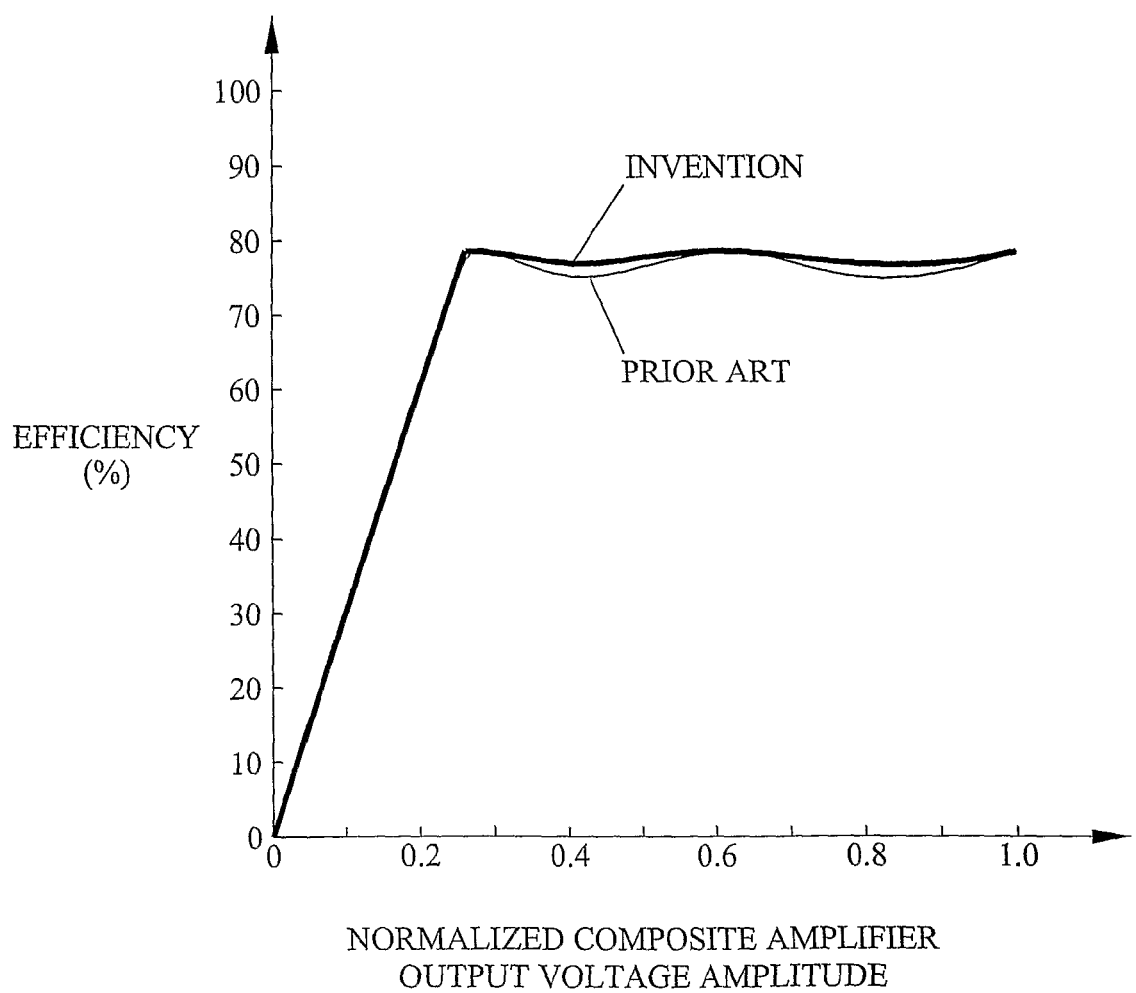
FIG. 49 is a diagram illustrating how the efficiency of the Chireix-Doherty amplifier in FIG. 44 depends on the normalized Chireix-Doherty amplifier output voltage.

As seen in FIG. 49, the efficiency curve of this amplifier is higher and more even than the original [18, FIG. 8]. This is due to the widened efficiency peaks. The average efficiency of this amplifier can thus be better, for many signal amplitude distributions, than the efficiency of the "correctly" tuned amplifier.

A common feature of all the described embodiments is that the nonlinear drive function is complex valued (instead of real valued as in the prior art) to compensate for the deficiencies (detuning, output current limitations) of the components in order to obtain optimum efficiency under the given circumstances. Expressed differently, the present invention provides a nonlinear drive function that has a phase that varies with the composite amplifier output voltage amplitude. This feature enables the described splitting of transition points into transition regions, which increases the efficiency.

The nonlinear functions are typically implemented as lookup tables, in which each amplitude corresponds to a complex value (amplitude and phase). The complex values can be found experimentally by optimizing the efficiency for each amplitude.

Another way to view the solution besides "transition point splitting" or drive current modification is to observe the behavior of the voltages at the output nodes of the transistors. Starting from low output voltages: In the new solution, a single transistor is used for amplification at low output levels. This transistor provides a linear current with constant phase offset to the output voltage. If the appropriate transistor is chosen, this always gives optimal operation in this region. When one of the output node voltages reaches its maximum, the other transistor starts operating. The combined operation of the two transistors in this next region aims to keep one output node at constant voltage (generally also by having varying phase difference between the transistors) while using minimum combined drive current magnitudes. When the other transistor's output node voltage also reaches its maximum amplitude, the drive currents are used to keep both transistor output nodes at constant (maximum) voltage. This is achieved, while still providing the required increase in output amplitude, by adjusting the phases of the drive currents along with an increase in amplitude.

Since optimal operation is possible in all of the described amplifiers by single transistor operation at low output levels, efficiency can be increased by turning off the other amplifier branches, including driver amplifiers, mixers, etc. in this region. This feature can be used both dynamically, if ramping up/down the hardware can be done with the same speed as the signal amplitude fluctuations, or quasi-statically, if long periods of low output levels are encountered. This is possible and can be used to advantage even in a perfectly balanced Chireix amplifier, by using the techniques described.

The amount of detuning for optimal efficiency depends, as stated earlier, on the actual signal amplitude distribution. One can however say that for Rayleigh-like signal amplitude distributions, slightly detuned Chireix amplifiers (described in Example 2) are usually the optimal two-transistor amplifiers. This is because the original Chireix's peak of the efficiency curve is "smeared out" (which in fact lowers the peak slightly) over a wider amplitude region. This matches better with the width of the Rayleigh distribution's region of high probability. In higher-order amplifier systems [17, 18, 19], the rule of thumb is generally to combine detuned Chireix stages with "smeared" efficiency peaks and detuned Doherty stages with rounded peaks, while concentrating the efficiency peaks in the amplitude region(s) of high probability.

The transitions between regions need not be as sharply defined as described in this document. In fact there can be advantages of having "rounded" transitions, such as reduced bandwidth of the drive signals [20].

In the description above only the most optimal operation for a limited set of examples has been described. The same ideas can, however, be used in all amplifiers whose operation is based on output "combination" networks. Even if "optimal" operation is not always achieved, there can be large gains in using the described techniques.

As indicated by the antennas in the various embodiments, the composite amplifier in accordance with the present invention may be part of a transmitter, for example a transmitter in a radio terminal, such as a base station or a mobile station in a cellular mobile radio communication system.

Some of the advantages of the present invention are:
General applicability: Can be used in all amplifiers whose operation is based on output "combination" networks.
Counteracts the problems of production variations.
Achieves better efficiency with any imperfect amplifier.
Obviates trimming.
Provides a means for raising the efficiency beyond that of existing amplifiers, by designing a deliberately detuned amplifier.
More efficient than state of the art amplifiers for any number of independently driven transistors, for many common signal amplitude distributions.

As noted above, the methods proposed can be used both for increasing efficiency for imperfect amplifiers, thereby reducing the need for trimming and/or high-precision manufacturing methods, and for designing amplifiers with optimal efficiency for a given application (amplitude distribution).

It will be understood by those skilled in the art that various modifications and changes may be made to the present invention without departure from the scope thereof, which is defined by the appended claims.

REFERENCES

[1] H. Chireix, "High Power Outphasing Modulation", Proc. IRE, vol. 23, no. 2, pp. 1370-1392, November 1935.
[2] W. H. Doherty, "A New High Efficiency Power Amplifier for Modulated Waves", Proc. IRE, vol. 24, no. 9, pp. 1163-1182, September 1936.
[3] F. H. Raab, "Efficiency of Outphasing RF Power Amplifier Systems", IEEE Trans. Communications, vol. COM-33, no. 10, pp. 1094-1099, October 1985.
[4] B. Stengel and W. R. Eisenstadt, "LINC Power Amplifier Combiner Method Efficiency Optimization", IEEE Trans. Vehicular Technology, vol. 49, no. 1, pp. 229-234, January 2000.
[5] X. Zhang and L. E. Larson, "Gain and Phase Error-Free LINC Transmitter", IEEE Trans. Vehicular Technology, vol. 49, no. 5, pp. 1986-1994, September 2000.
[6] "Ampliphase AM Transmission System", ABU Technical Review, no. 33, pp. 10-18, July 1974.
[7] I. Ullah, "Output Circuit of an Ampliphase Broadcast Transmitter", ABU Technical Review, no. 63, pp. 17-24, July 1979.
[8] A. S. Wright, S. J. Bennett, U.S. Pat. No. 6,054,896, April 2000.
[9] R. E. Stengel, S. A. Olson, U.S. Pat. No. 5,901,346, May 1999.
[10] F. H. Raab, "Efficiency of Doherty RF Power Amplifier Systems", IEEE Trans. Broadcasting, vol. BC-33, no. 3, pp. 77-83, September 1987.
[11] D. M. Upton et al. "A New Circuit Topology to Realize High Efficiency, High Linearity, and High Power Microwave Amplifiers", IEEE Proc. RAWCON' 98, pp. 317-320.
[12] J. J. Schuss et al., U.S. Pat. No. 5,568,086, October 1996.
[13] I. Barak et al., WO 01/91282 A2, November 2001.
[14] R. Hellberg, WO 02/05421 A1, January 2002.
[15] R. Hellberg, WO 03/047093 A1, June 2003.
[16] R. Hellberg, WO 03/061115 A1, July 2003.
[17] R. Hellberg, M. Klingberg, WO 2004/023647 A1, March 2004.
[18] R. Hellberg, M. Klingberg, WO 2004/057755 A1, July 2004.
[19] M. Klingberg, R. Hellberg, WO 2005/031966 A1, April 2005
[20] R. Hellberg, WO 01/95480 A1, December 2001.
[21] K. Meinzer, "Method and System for the Linear Amplification of Signals", U.S. Pat. No. 5,012,200.

The invention claimed is:

1. A detuned composite amplifier including a nonlinear drive function, wherein the nonlinear drive function has a phase that varies with the composite amplifier output voltage amplitude, wherein the nonlinear drive function is complex valued, and wherein the nonlinear drive function is configured to transform at least one output voltage transition point into an extended output voltage transition region.

2. The composite amplifier of claim 1, wherein the composite amplifier is a detuned Doherty amplifier.

3. The composite amplifier of claim 2, wherein the nonlinear drive function is configured to produce an operating region with two amplifiers at maximum output voltage.

4. The composite amplifier of claim 1, wherein the composite amplifier is a detuned Chireix amplifier.

5. The composite amplifier of claim 4, wherein the nonlinear drive function is configured to produce an operating region with only one amplifier at maximum output voltage.

6. The composite amplifier of claim 4, wherein the nonlinear drive function is configured to prevent one amplifier from delivering any output current as long as the output signal amplitude of the composite amplifier does not exceed a predetermined threshold.

7. The composite amplifier of claim 4, wherein the nonlinear drive function is configured to produce unequal output current amplitudes from the two amplifiers in at least one output voltage region.

8. The composite amplifier of claim 4, wherein the nonlinear drive function is configured to produce an outphasing region with both amplifiers having a constant output voltage but different phases relative to the composite amplifier output signal phase.

9. The composite amplifier of claim 1, wherein the composite amplifier is a detuned combined Chireix-Doherty amplifier.

10. The composite amplifier of claim 9, wherein the nonlinear drive function is configured to produce an outphasing region with at least two amplifiers having a constant output voltage but different phases relative to the composite amplifier output signal phase.

11. The composite amplifier of claim 1, wherein the nonlinear drive function is configured to drive two amplifiers in a region with one amplifier at maximum voltage and in a region with both amplifiers at maximum voltage, the second region being more extended than a singular point at max power.

12. The composite amplifier of claim 1, wherein the nonlinear drive function is configured to drive amplifiers in a region with one amplifier at maximum voltage, in at leas one further region with at least one further amplifier at maximum voltage, and in a region with all amplifiers at maximum voltage, the last mentioned region being more extended than a singular point at max power.

13. The composite amplifier of claim 1, wherein the nonlinear drive function is configured to transform at least one output voltage transition point into an extended output voltage transition region.

14. A transmitter comprising a detuned composite amplifier including a nonlinear drive function, wherein the nonlinear drive function has a phase that varies with the composite amplifier output voltage amplitude, wherein the nonlinear drive function is complex valued, and wherein the nonlinear drive function is configured to transform at least one output voltage transition point into an extended output voltage transition region.

15. A method of driving a detuned composite amplifier including a nonlinear drive function, said method comprising the step of configuring the nonlinear drive function with a phase that varies with the composite amplifier output voltage amplitude, wherein the nonlinear drive function is complex valued and wherein the nonlinear drive function is configured to transform at least one output voltage transition point into an extended output voltage transition region.

16. The method of claim 15, wherein the composite amplifier is a Doherty amplifier.

17. The method of claim 16, wherein the nonlinear drive function is configured to produce an operating region with two amplifiers at maximum output voltage.

18. The method of claim 15, wherein the composite amplifier is a Chireix amplifier.

19. The method of claim 18, wherein the nonlinear drive function is configured to produce an operating region with only one amplifier at maximum output voltage.

20. The method of claim 19, wherein the nonlinear drive function is configured to prevent one amplifier from delivering any output current as long as the output signal amplitude of the composite amplifier does not exceed a predetermined threshold.

21. The method of claim 19, wherein the nonlinear drive function is configured to produce unequal output current amplitudes from the two amplifiers in at least one output voltage region.

22. The method of claim 19, wherein the nonlinear drive function is configured to produce an outphasing region with both amplifiers having a constant output voltage but different phases relative to the composite amplifier output signal phase.

23. The method of claim 15, wherein the composite amplifier is a combined Doherty-Chireix amplifier.

24. The method of claim 23, wherein the nonlinear drive function is configured to produce an outphasing region with at least two amplifiers having a constant output voltage but different phases relative to the composite amplifier output signal phase.

25. The method of claim 15, wherein the nonlinear drive function is configured to drive two amplifiers in a region with one amplifier at maximum voltage and in a region with both amplifiers at maximum voltage, the second region being more extended than a singular point at max power.

26. The method of claim 15, wherein the nonlinear drive function is configured to drive amplifiers in a region with one amplifier at maximum voltage, in at least one further region with at least one further amplifier at maximum voltage, and in a region with all amplifiers at maximum voltage, the last mentioned region being more extended than a singular point at max power.

27. The method of claim 15, wherein the nonlinear drive function is configured to transform at least one output voltage transition point into an extended output voltage transition region.

* * * * *

UNITED STATES PATENT AND TRADEMARK OFFICE
CERTIFICATE OF CORRECTION

| | | |
|---|---|---|
| PATENT NO. | : 7,893,762 B2 | Page 1 of 1 |
| APPLICATION NO. | : 12/159735 | |
| DATED | : February 22, 2011 | |
| INVENTOR(S) | : Hellberg et al. | |

It is certified that error appears in the above-identified patent and that said Letters Patent is hereby corrected as shown below:

On the Face Page, in Field (56), under "U.S. PATENT DOCUMENTS", in Column 2, Line 6, delete "Hellburg" and insert -- Hellberg --, therefor.

Figure 47:
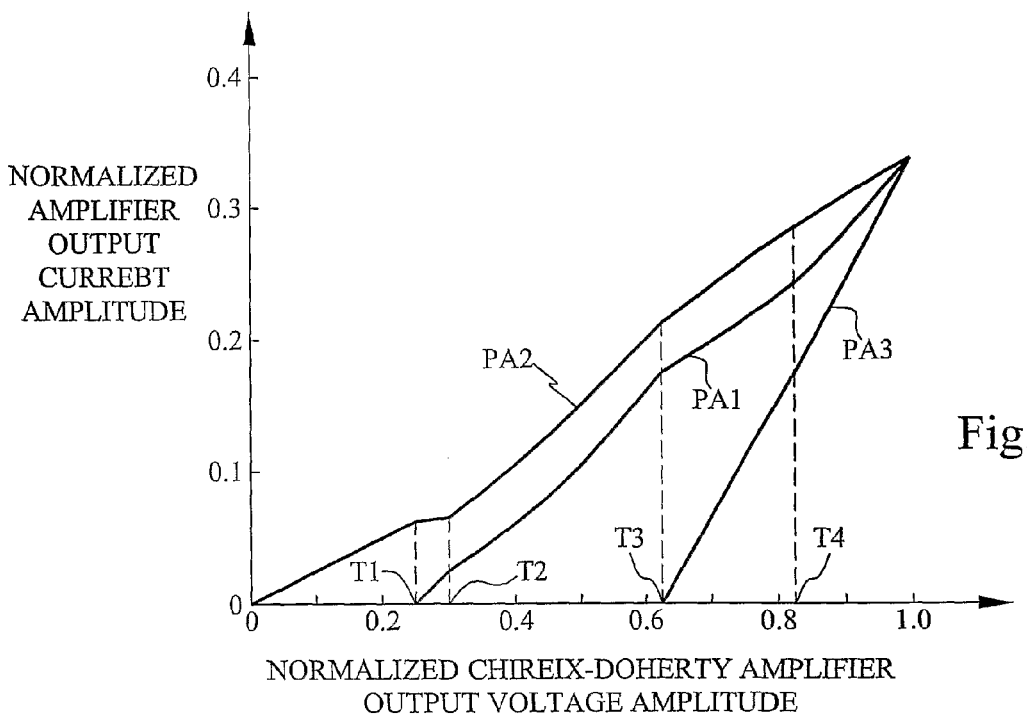
FIG. 47 is a diagram illustrating how the amplitude of the output current of the constituent amplifiers in FIG. 44 depends on the normalized Chireix-Doherty amplifier output voltage.
Figure 48:
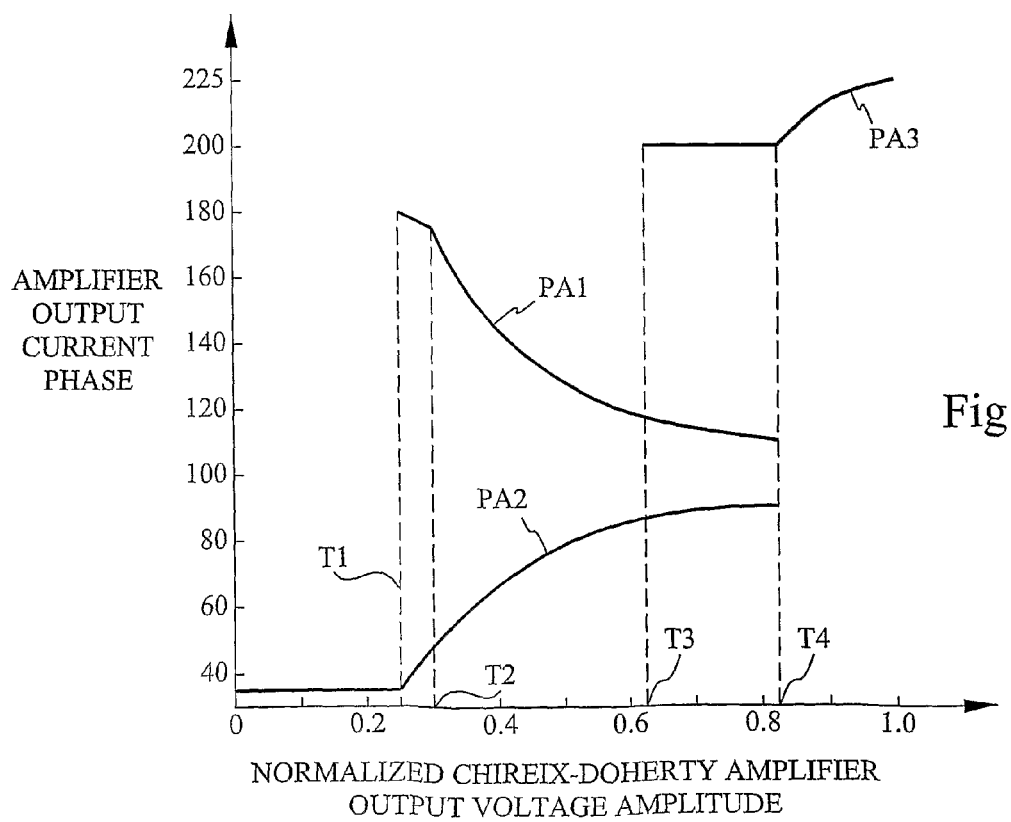
FIG. 48 is a diagram illustrating how the phase of the output current of the constituent amplifiers in FIG. 44 depends on the normalized Chireix-Doherty amplifier output voltage.

In Fig. 47, Sheet 28 of 29, delete "CURREBT" and insert -- CURRENT --, therefor.

In Column 6, Line 67, delete "RP" and insert -- RF --, therefor.

In Column 13, Line 3, in Claim 12, delete "leas" and insert -- least --, therefor.

In Column 13, Line 26, in Claim 15, delete "valued" and insert -- valued, --, therefor.

Signed and Sealed this
Twenty-fourth Day of May, 2011

David J. Kappos
*Director of the United States Patent and Trademark Office*